(12) United States Patent
Bean et al.

(10) Patent No.: US 10,901,327 B2
(45) Date of Patent: Jan. 26, 2021

(54) AUTOMATIC DEFECT ANALYZER FOR NANOIMPRINT LITHOGRAPHY USING IMAGE ANALYSIS

(71) Applicant: CANON KABUSHIKI KAISHA, Tokyo (JP)

(72) Inventors: Kathryn Brenda Bean, Liberty Hill, TX (US); Teresa Perez Estrada, Pflugerville, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 125 days.

(21) Appl. No.: 16/227,614

(22) Filed: Dec. 20, 2018

(65) Prior Publication Data
US 2020/0201190 A1    Jun. 25, 2020

(51) Int. Cl.
*B82Y 10/00* (2011.01)
*G03F 7/20* (2006.01)
*G03F 7/00* (2006.01)
*B82Y 40/00* (2011.01)

(52) U.S. Cl.
CPC .......... *G03F 7/7065* (2013.01); *G03F 7/0002* (2013.01); *G03F 7/70625* (2013.01); *B82Y 10/00* (2013.01); *B82Y 40/00* (2013.01)

(58) Field of Classification Search
CPC combination set(s) only.
See application file for complete search history.

(56) References Cited

U.S. PATENT DOCUMENTS

| | | |
|---|---|---|
| 5,543,921 A | 8/1996 | Uzawa et al. |
| 6,792,856 B2 | 9/2004 | Hall et al. |
| 6,902,855 B2 | 6/2005 | Peterson et al. |
| 7,773,287 B2 * | 8/2010 | Latypov .............. G03F 7/70291 359/292 |
| 9,488,819 B2 | 11/2016 | Putman et al. |
| 9,547,235 B2 | 1/2017 | Lammers et al. |
| 9,561,566 B2 | 2/2017 | Putman et al. |

(Continued)

FOREIGN PATENT DOCUMENTS

| | | |
|---|---|---|
| EP | 2435982 B1 | 10/2012 |
| JP | 2015-35509 A | 2/2015 |
| WO | 2009/038838 A2 | 3/2009 |

OTHER PUBLICATIONS

S.V. Sreenivasan ,"Nanoimprint lithography steppers for volume fabrication of leading-edge semiconductor integrated circuits", Microsystems & Nanoengineering (2017) 3, 17075; doi:10.1038/micronano.2017.75; Published online: Sep. 25, 2017, pp. 1-14).*

(Continued)

*Primary Examiner* — Omar S Ismail
(74) *Attorney, Agent, or Firm* — Canon U.S.A., Inc. IP Division

(57) ABSTRACT

A plurality of images of a plurality of fields is acquired using an image sensor under varying conditions associated with a defect. Defect pixels in a test image in the plurality of images are identified using a standard image to provide a defect tolerance level. The standard image has no defects. Clustering analysis is performed on the identified defect pixels based on the defect tolerance level to obtain defect clusters. A process window is generated based on the defect clusters. An imprint process is created according to the process window.

20 Claims, 16 Drawing Sheets

(56) References Cited

U.S. PATENT DOCUMENTS

| | | | |
|---|---|---|---|
| 9,952,504 B2 | 4/2018 | Miyajima et al. | |
| 2004/0115696 A1 | 6/2004 | Heller | |
| 2004/0209177 A1* | 10/2004 | Sreenivasan | B29C 43/021 |
| | | | 430/22 |
| 2008/0034184 A1* | 2/2008 | Norman | G09G 3/2088 |
| | | | 712/17 |
| 2009/0200710 A1* | 8/2009 | Khusnatdinov | B82Y 40/00 |
| | | | 264/496 |
| 2011/0286656 A1* | 11/2011 | Kulkarni | G06F 30/30 |
| | | | 382/144 |
| 2011/0290136 A1 | 12/2011 | Koga | |
| 2012/0217675 A1 | 8/2012 | Usui | |
| 2013/0242354 A1* | 9/2013 | Dewancker | H04N 1/00055 |
| | | | 358/448 |
| 2013/0306101 A1* | 11/2013 | Swanson | B08B 7/0092 |
| | | | 134/1.1 |
| 2015/0154746 A1* | 6/2015 | Zafar | G06T 7/0006 |
| | | | 382/149 |
| 2017/0235117 A1 | 8/2017 | Putman et al. | |
| 2017/0336713 A1 | 11/2017 | Middlebrooks et al. | |
| 2018/0164678 A1* | 6/2018 | Fletcher | G06K 15/105 |

OTHER PUBLICATIONS

S.V. Sreenivasan ,"Nanoinnprint lithography steppers for volume fabrication of leading-edge semiconductor integrated circuits", Microsystems & Nanoengineering (2017) 3, 17075; doi:10.1038/micronano.2017.75; Published online: Sep. 25, 2017, pp. 1-14).*

Donald G. Bailey, Christopher T. Johnston, Ni Ma; "Connected Components Analysis of Streamed Images," 2008 International Conference on Field Programmable Logic and Applications; Sep. 8, 2008, pp. 679-682, IEEE, Piscataway NJ, 2008.

* cited by examiner crop standard and test images in <u>proximity</u> to the area that could exhibit a defect For steps 510 and 522 crop the image <u>around</u> the area that could exhibit a defect

For steps 810 and 820

AUTOMATIC DEFECT ANALYZER FOR NANOIMPRINT LITHOGRAPHY USING IMAGE ANALYSIS

BACKGROUND OF THE INVENTION

Field of the Invention

One disclosed aspect of the embodiments relates to defect analysis for nanoimprint lithography.

Description of the Related Art

Nanoimprint lithography has become increasingly popular recently.

There are a number of issues in the semiconductor fabrication using nanoimprint lithography. A basic requirement is accurate distribution of fluid across the field. In imprint lithography, the formable material needs to be dispensed in a controlled manner to ensure that a proper amount of formable material is dispensed in correct locations and areal densities on the substrate. Centers of fluid droplets closest to the edges of the imprint field are placed such that, during an imprint operation, a proper amount of formable material can flow toward the edge of the imprint field. If the fluid droplets are too close to the edge, a portion of the formable material can flow beyond an edge of the imprint lithography template, and such portion of the formable material can result in an extrusion defect during a curing operation. The extrusion defect may adhere to the lithography template and cause the extrusion defect to be printed in the next imprint field. Extrusion is a defect that occurs when there is excess formable material (over filled condition) that goes beyond the edge of the imprint and is cured. Extrusions have a height greater than the feature height and the residual layer thickness (RLT) of the resist used for the pattern. If the fluid droplets are too far from the edge, incomplete filling of template features may occur. Such defects are called "non-fill" defects and translate to a loss of features upon pattern transfer. In other words, non-fill is a defect that occurs when there is lack of resist (formable material) to fill the edge of the imprint. Extrusion defects and non-fill defects are undesired.

To detect these defects, techniques in image processing may be employed. Current defect detection is done manually by human inspectors. The process is typically time consuming and is subjective based on the inspector.

Identification of these defects may be done using a variety of inspection equipment, including but not limited to an optical microscope, a profilometer, an SEM, a SPM, or any instrument that can be configured to provide information about the variation of height of the cured formable height across the imprint field. The inspection equipment can provide test images which are representative of the height of the formable material on each imprint field. It may take 1000 s of test images to represent the statistical behavior of a process over varying process conditions and many imprinted fields. There can be inconsistencies in the absolute intensity of these test images due to equipment, operator, substrate, environment, and other process conditions. Therefore, it may be necessary to find an acceptable ranges of intensity variations to identify images outside of this range. Software to analyze images having in an intensity variation within these ranges is sought.

SUMMARY OF THE INVENTION

A plurality of images of a plurality of fields is acquired using an image sensor under varying process conditions associated with a defect. Some examples of the process conditions are: different drop patterns, different levels of residual layer thickness (RLT), different curing times, and different values of drop edge exclusion (DEE). Defect pixels in a test image in the plurality of images are identified using a standard image to provide a defect tolerance level. The standard image (golden image) has no defects. While a test image may or may not exhibit a defect. The disclosure provides an analysis of images having an intensity variation within a range. The tolerance levels for extrusion and non-fill defects are determined. When the value of pixel intensities, between a test image and its corresponding golden image exceeds the threshold, the test image has a defect and defect identification is performed using one of the aforementioned tolerance levels to generate a process window. Some of the process conditions of an imprint process, such as a value of drop edge exclusion, is modified according to the defect identification results and the generated process window. A golden image is an image within a set of images that is free of defects from extrusion or non-fill.

An aspect of the embodiment determines tolerances levels for extrusion and non-fill defects as mentioned above. If the absolute value of pixel intensities, between a test image and its corresponding golden image, exceed this threshold, this image has a defect and performs defect inspection using one of the aforementioned tolerance levels.

Further features of the disclosure will become apparent from the following description of exemplary embodiments with reference to the attached drawings.

DESCRIPTION OF THE EMBODIMENTS

Figure 1:
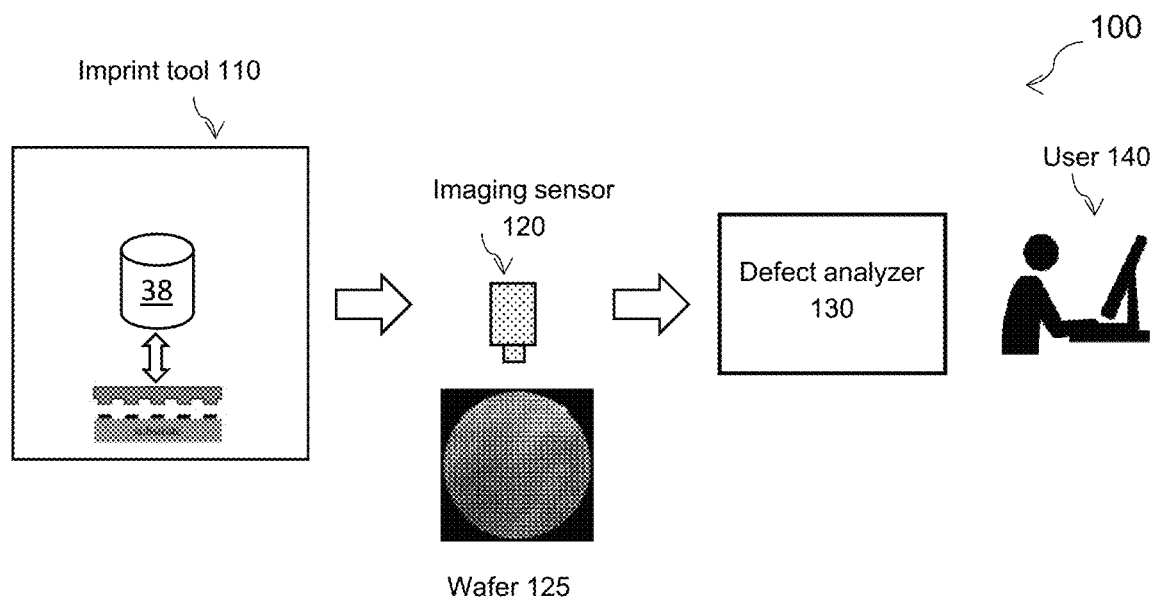
FIG. 1 is a diagram illustrating a system for automatic defect analyzer.

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

A variety of process parameters are used to control an imprint lithography tool and process. Examples of such process parameters include but are not limited to: residual thickness layer (RTL), drop edge exclusion (DEE), drop placement pattern, spread time, drop volume, etc. Each of these process parameters have a range of values (process condition window) in which acceptable imprint performance can be obtained. Identifying this process condition window can be very difficult and requires the inspection of 1000 s of test images. One criteria for an acceptable imprint performance is minimum extrusions (ideally zero) and minimum (ideally zero) non-fill. For example, in order to accurately compare the extrusion performance, in imprint lithography, Extrusion Free Zone (EFZ) is a term used to identify the process window for the process condition with no defects. This is typically the process condition between the point of non-fill and extrusion. Drop edge exclusion (DEE) is a process condition that directly correlates with non-fill and extrusion. The DEE defines the distance of resist drops relative to the edge of an imprint/shot. This is typically measured in microns (μm).

A fluid droplet pattern may refer to an actual pattern that physically exists or will exist or a virtual pattern that can be a computer generated representation of fluid droplet pattern. The term "substrate fluid droplet pattern" refers to a particular actual pattern of fluid droplets as formed on a substrate. An "adjusted fluid droplet pattern" refers to a particular virtual droplet pattern, and in an embodiment, such virtual droplet pattern can be corresponded to the substrate fluid droplet pattern produced when using the adjusted fluid droplet pattern.

The term "pitch" is intended to mean a distance from a center of a feature to a center of a next adjacent feature. For a fluid droplet pattern, the pitch is a distance from the center of a droplet to the center of the next adjacent droplet. In Cartesian coordinates, a two-dimensional pattern (a pattern as seen from a top or plan view) can have a pitch in the X-direction that corresponds to the distance between the centers of the features as measured in the X-direction (X-direction pitch), and a pitch in the Y-direction that corresponds to the distance between the centers of the features as measured in the Y-direction (Y-direction pitch). The X-direction pitch may be the same or different from the Y-direction pitch.

As used herein, speed and motion may be described on a relative basis. For example, object A and object B move relative to each other. Such terminology is intended to cover object A is moving, and object B is not; object A is not moving, and object B is moving; and both of objects A and B are moving.

As used herein, the terms "comprises," "comprising," "includes," "including," "has," "having," or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

The use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

In imprint lithography, the formable material needs to be dispensed in a controlled manner to ensure that a proper amount of formable material is dispensed in correct locations and areal densities on the substrate.

FIG. 1 illustrates an idealized substrate fluid drop pattern with proper DEE. The imprint field can be expressed in Cartesian coordinates along an X-direction and a Y-direction. The centers of fluid droplets along the column closest to the left-hand side lie along a line that is a distance X1 from the left-hand edge, and the centers of fluid droplets along the column closest to the right-hand side lie along a line that is a distance X2 from the right-hand edge. The centers of fluid droplets along the column closest to the bottom of the imprint field lie along a line that is a distance Y1 from the bottom edge, and the centers of fluid droplets along the column closest to the top of the imprint field lie along a line that is a distance Y2 from the top edge. Such lines are referred to herein as the X1 line, X2 line, Y1 line, and the Y2 line of the DEE. In FIG. 1, the fluid droplets have a uniform pitch in each of the X-direction and the Y-direction.

One disclosed aspect of the embodiments includes a defect analyzer to analyze defects in imprints of fields from nanoimprint lithography. The defect analyzer is an image analysis tool used to provide a non-subjective automated process to identify the number of defects (e.g., extrusion, non-fill). In one embodiment, the defect analyzer is a software program created to evaluate a set of images utilizing statistical methods and clustering analysis.

The aspect of the embodiment includes determining a process window for extrusion control using the defect analyzer tool described below to analyze images collected, then identify the drop edge exclusion conditions for non-fill and extrusions.

A plurality of images of a plurality of fields is acquired using an image sensor. The plurality of images collected comes from an imprinted wafer. The wafer is imprinted with varying process conditions associated with a defect. Varying process conditions can be but are not limited to DEE, spread time, Helium Flow, residual thickness layer (RTL), drop placement pattern, drop volume, etc. Defect pixels in a test image in the plurality of images are identified using a standard image to provide a defect tolerance level. Clustering analysis is performed on the identified defect pixels based on the defect tolerance level to obtain defect clusters. A process window is generated based on the results of the identified defect clusters. An imprinting process which may include a drop pattern is created according to the process window.

FIG. 1 is a diagram illustrating a system 100 for an automatic defect analyzer. The system 100 includes an imprint tool 110 with a source 38, an imaging sensor 120, a wafer 125, a defect analyzer 130, and a user 140. The system 100 may include more or less than the above components.

Figure 2:
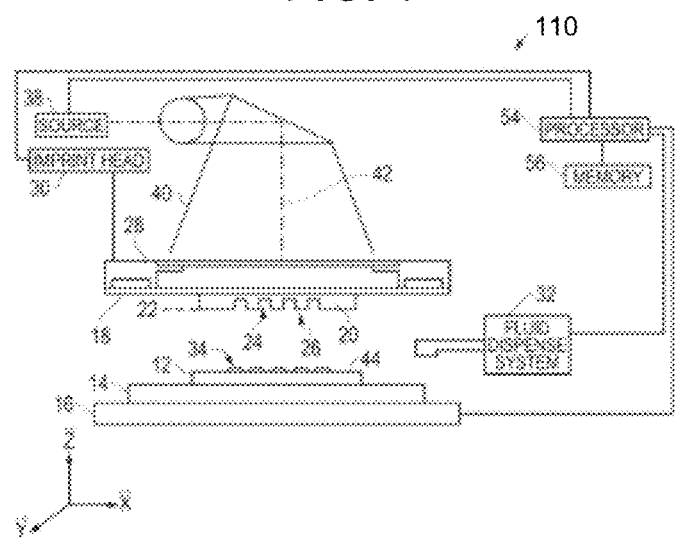
FIG. 2 is a diagram illustrating a simplified side view of an exemplary imprint lithography system according to one embodiment.

The imprint tool 110 also illustrated in FIG. 2 is an apparatus that imprints pattern fields. In one embodiment, the apparatus is an imprint apparatus that includes an image sensor, a processor and a memory coupled to the processor. It forms a fine pattern on a substrate 12 in a process to produce a semiconductor wafer, a semiconductor device, or the like. It makes an imprint material 34 supplied to the substrate 125 and when a mold 20 comes into contact with the material and a source 38 cures the imprint material 34 to form a pattern of a cured composition onto which a concave-convex pattern of the mold 20 is transferred. The result of the imprinting process by the imprint tool 110 is the wafer 125. The wafer 125 may include a plurality of fields which reflect the patterns of the semiconductor device. The imaging sensor 120 in an optical component that captures an image of the wafer 125. It may be a semiconductor image sensor, an optical image microscope, a camera, or any other device that can obtain relevant information (such as height) about the wafer 125. The captured image may include image of the plurality of imprinted fields.

The defect analyzer 130 analyzes the defects in the plurality of imprinted fields in the captured image of the wafer 125. In general, the defect analyzer 130 is a computer-based system that performs image analysis, obtains statistical information, identifies defects generates an inspection result such as determining whether there are defects in the image, and generates a process window which gives the user information that can be used to reduce defects. The defect analyzer 130 typically provides a non-subjective inspection of the images and defects found within.

The user 140 is an operator of the defect analyzer 130. The user 140 may generate commands, interprets the results, and interacts with the defect analyzer 130.

In imprint lithography, the formable material needs to be dispensed in a controlled manner to ensure that a proper amount of formable material is dispensed in correct locations and areal densities on the substrate. Centers of fluid droplets closest to the edges of the imprint field are placed such that, during an imprint operation, a proper amount of formable material can flow toward the edge of the imprint field. If the fluid droplets are too close to the edge, a portion of the formable material can flow beyond an edge of the imprint lithography template, and such portion of the formable material can result in an extrusion defect during a curing operation. The extrusion defect may adhere to the lithography template and cause the extrusion defect to be printed in the next imprint field. If the fluid droplets are too far from the edge, incomplete filling of template features may occur. Such defects are called "non-fill" defects and translate to a loss of features upon pattern transfer.

Figure 4:
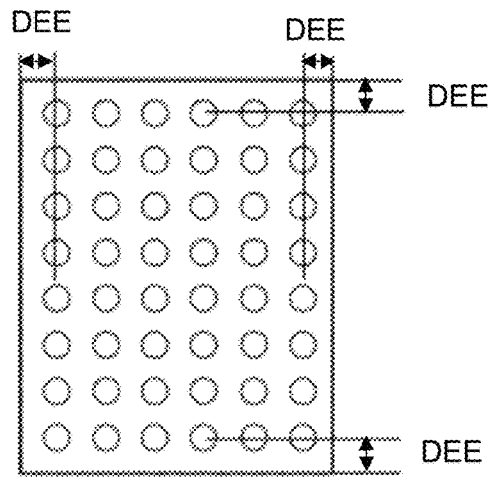
FIG. 4 is a diagram illustrating a fluid droplet pattern in which the fluid droplet pitch matches the X-direction and Y-direction alignment for a drop edge exclusion.

A drop edge exclusion (DEE) refers to an exclusion around (zone or region) a substrate fluid droplet pattern to achieve a proper amount of formable material near the edge of an imprint field that reduces the likelihood that (1) the formable material will flow beyond the edge of the imprint lithography template and (2) non-fill defects will occur. FIG. 4 illustrates an idealized substrate fluid drop pattern with proper DEE (the distance of resist drops relative to the edge of an imprint/shot. This is typically measured in microns. The imprint field can be expressed in Cartesian coordinates along an X-direction and a Y-direction. The centers of fluid droplets along the column closest to the left-hand side lie along a line that is a distance X1 from the left-hand edge, and the centers of fluid droplets along the column closest to the right-hand side lie along a line that is a distance X2 from the right-hand edge. The centers of fluid droplets along the column closest to the bottom of the imprint field lie along a line that is a distance Y1 from the bottom edge, and the centers of fluid droplets along the column closest to the top of the imprint field lie along a line that is a distance Y2 from the top edge. Such lines are referred to herein as the X1 line, X2 line, Y1 line, and the Y2 line of the DEE. In FIG. 1, the fluid droplets have a uniform pitch in each of the X-direction and the Y-direction.

Referring to the figures, and particularly to FIG. 2, a lithographic system (imprint tool) 110 in accordance with embodiments described herein can be used to form a relief pattern on a substrate 12. The substrate 12 may be coupled to a substrate chuck 14. As illustrated, substrate chuck 14 is a vacuum chuck; however, in other embodiments the substrate chuck 14 may be any chuck including vacuum, pin-type, groove-type, electrostatic, electromagnetic, or the like.

Substrate 12 and substrate chuck 14 may be further supported by a stage 16. The stage 16 may provide translating or rotational motion along the X-, Y-, or Z-directions. The stage 16, substrate 12, and substrate chuck 14 may also be positioned on a base (not illustrated).

Spaced-apart from the substrate 12 is a template 18. The template 18 can include a body having a first side and a second side with one side having a mesa 20 extending therefrom towards the substrate 12. The mesa 20 is sometimes referred to as a mold 20. In an embodiment, the template 18 can be formed without a mesa 20.

The template 18 or mold 20 may be formed from such materials including fused-silica, quartz, silicon, organic polymers, siloxane polymers, borosilicate glass, fluorocarbon polymers, metal, hardened sapphire, other similar materials, or any combination thereof. The template 18 and mold 20 can include a single piece construction. Alternatively, the template 18 and mold 20 can include separate components coupled together. As illustrated, a patterning surface 22 includes features defined by spaced-apart recesses 24 and protrusions 26. The disclosure is not intended to be limited to such configurations (e.g., planar surfaces). The patterning surface 22 may define any original pattern that forms the basis of a pattern to be formed on the substrate 12. In another embodiment, the patterning surface 22 can be a blank, that is, the patterning surface 22 does not have any recesses or projections.

The template 18 can be coupled to a template chuck 28. The template chuck 28 can be configured as vacuum, pin-type, groove-type, electrostatic, electromagnetic, or another similar chuck type. Exemplary chucks are further described in U.S. Pat. No. 6,873,087. In an embodiment, the template chuck 28 may be coupled to an imprint head 30 such that the template chuck 28 or imprint head 30 can facilitate movement of the template 18.

The lithographic system 10 can further include a fluid dispense system 32 used to deposit a formable material 34 on the substrate 12. For example, the formable material can include a polymerizable material, such as a resin. The formable material 34 can be positioned on the substrate 12 in one or more layers using techniques such as droplet dispense, spin-coating, dip coating, chemical vapor deposition (CVD), physical vapor deposition (PVD), thin film deposition, thick film deposition, or combinations thereof. The formable material 34 can be dispensed upon the substrate 12 before or after a desired volume is defined between the mold 20 and the substrate 12 depending on design considerations. For example, the formable material 34 can include a monomer mixture.

Figure 3:
FIG. 3 is a diagram illustrating a simplified cross-sectional view of the substrate illustrated in FIG. 2 having a patterned layer according to one embodiment.

Referring to FIGS. 2 and 3, the lithographic system 110 can further include an energy source 38 coupled to a direct energy 40 along a path 42. The imprint head 30 and stage 16 can be configured to position the template 18 and substrate 12 in superimposition with the path 42. The lithographic system 1110 can be regulated by a logic element 54 in communication with the stage 16, imprint head 30, fluid dispense system 32, or source 38, and may operate on a computer readable program, optionally stored in memory 56. The computer readable program may be stored on a non-transitory computer readable medium.

In an embodiment, either the imprint head 30, the stage 16, or both the imprint head 30 and the stage 16 vary a distance between the mold 20 and the substrate 12 to define a desired volume therebetween that is filled by the formable material 34. For example, the imprint head 30 can apply a force to the template 18 such that the mold 20 contacts the formable material 34 on the substrate 12. After the desired volume is filled with the formable material 34, the energy source 38 can produce energy 40, e.g., ultraviolet radiation, causing the formable material 34 to solidify or cross-link conforming to a shape of the surface 44 of the substrate 12 and patterning surface 22 defining a patterned layer 46 (shown in FIG. 3) on the substrate 12. The patterned layer 46 can include features illustrated as protrusions 50 and recessions 52, with the protrusions 50 having a thickness, $t_1$ and the recessions 52 correspond to a residual layer having a thickness $t_2$, which is the residual layer thickness (RLT) 48 (of the resist used for the pattern).

High throughput at low defect density is an important consideration in imprint lithography processes. When employing a droplet dispense method of applying the formable material to the substrate 12, the imprint process cycle generally includes (1) dispensing (or depositing) fluid droplets of formable material 34 on a substrate surface 44, (2) bringing a template 18 into contact with the fluid droplets 34 such that the fluid spreads and fills the topography of the template patterning surface 22, (3) solidifying (e.g., photo-curing) the fluid, and (4) separating the template 18 from the substrate 12, leaving a solidified layer of formable material 46 having a relief image of the template pattern on the substrate surface 44. Dispensing fluid droplets of formable material 34 on the substrate surface 44 and proper filling of the pattern of the template 18 are major contributors to the imprint cycle time, and thus throughput.

During dispensing, fluid droplets of formable material 34 are dispensed from the fluid dispense system 32 to create a pattern of fluid droplets on the substrate surface 44. The fluid droplet pattern can be determined such that the total volume of the fluid droplets on the surface matches the total volume for the desired fluid droplet pattern. As well as matching the total volume of the desired fluid droplet pattern, it may be desirable to match the local volume of the desired fluid droplet pattern. Thus, a greater volume of fluid can be dispensed in a region of the substrate 12 where a greater volume of formable material is desired.

Available inkjet systems can be tuned to dispense formable material fluid droplets with volumes in the range of 0.1 to 10 picoliters (pL) or greater, with 0.9 pL being an exemplary fluid droplet volume. The fluid droplets can be dispensed in patterns formed by one or more passes of the imprint head 30 and substrate 12 relative to one another. An exemplary pattern includes a rectangular, grid pattern, a diamond pattern, another suitable pattern, or any combination thereof.

FIG. 4 illustrates an idealized substrate fluid drop pattern with a specific DEE. The imprint field can be expressed in Cartesian coordinates along an X-direction and a Y-direction. The centers of fluid droplets along the column closest to the left-hand side lie along a line that is a distance X1 from the left-hand edge, and the centers of fluid droplets along the column closest to the right-hand side lie along a line that is a distance X2 from the right-hand edge. The centers of fluid droplets along the column closest to the bottom of the imprint field along the column closest to the top of the imprint field lie along a line that is a distance Y2 from the top edge. Such lines are referred to herein as the X1 line, X2 lines, Y1 line, and the Y2 line of the DEE. In FIG. 4, the fluid droplets have a uniform pitch in each of the X-direction and the Y-direction.

Figure 5:
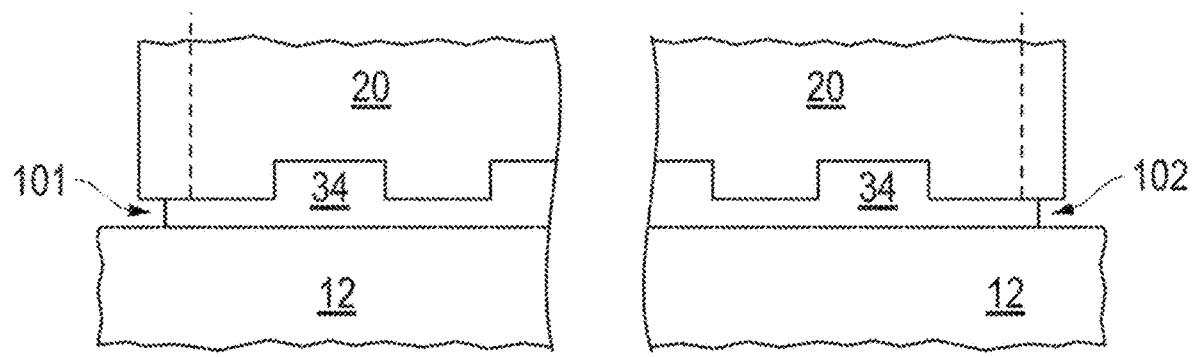
FIG. 5 is a diagram illustrating the substrate and imprint lithography template during imprinting according to one embodiment.

As illustrated in FIG. 4 centers of fluid droplets closest to the edges of the imprint field are placed such that, during an imprint operation, a proper amount of formable material can flow toward the edge of the imprint field as illustrated in FIG. 5. If the fluid droplets are too close to the edge, a portion of the formable material can flow beyond an edge of the imprint lithography template, and such portion of the formable material can result in an extrusion defect during a curing operation. The extrusion defect may adhere to the lithography template and cause the extrusion defect to be printed in the next imprint field. If the fluid droplets are too far from the edge, incomplete filling of template features may occur. Such defects are called "non-fill" defects and translate to a loss of features upon pattern transfer. Extrusion defects and non-fill defects are undesired.

A drop edge exclusion (DEE) as illustrated in FIG. 4 refers to an exclusion around a substrate fluid droplet pattern to achieve a proper amount of formable material near the edge of an imprint field that reduces the likelihood that (1) the formable material will flow beyond the edge of the imprint lithography template and (2) non-fill defects will occur.

FIG. 5 includes an illustration of portions of the substrate 12, formable material 34, and the mold 20. The left-hand portion illustrates the edge of the imprint field adjacent to the Y1 line of the DEE, and the right-hand portion illustrates the edge of the imprint field adjacent to the Y2 line of the DEE. The contact between the mold 20 of the template and the formable material 34 causes recessions in the mold 20 to fill and fill in the gaps between fluid droplets. The proper dispensing of fluid droplets allows some of the formable material to flow further from the Y1 and Y2 lines of the DEE and toward the edge of the imprint field; however, the formable material 34 does not flow beyond the edges of the mold 20 forming extrusions. Gaps 101 and 102 between the edges of the formable material 34 and the mold 20 are controlled and kept relatively small.

Figure 6A:
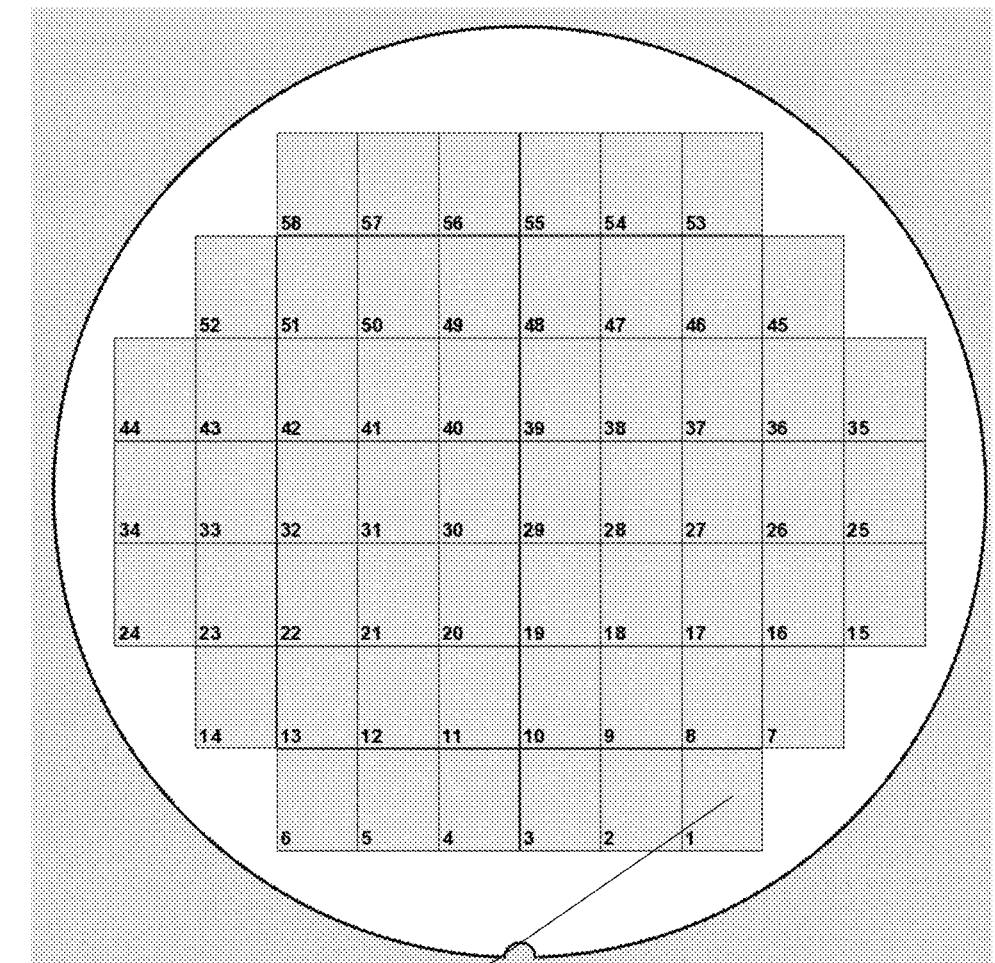
FIGS. 6A-6D are diagrams illustrating an overview of basic imprint.
Figures 6B, 6C, 6D:
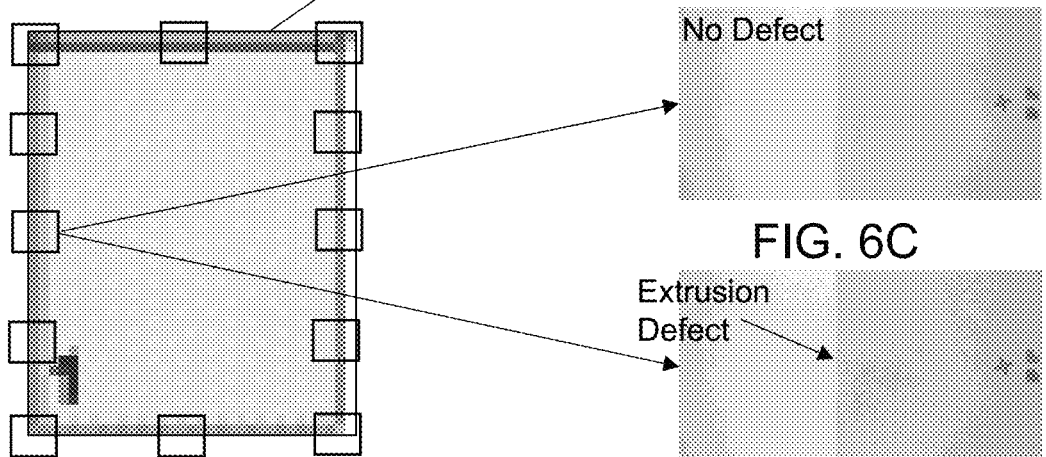

FIGS. 6A-6D are diagrams illustrating an overview of basic imprint. FIG. 6A illustrates a wafer (i.e., wafer 125) having imprint fields. In one embodiment the wafer has 58 imprint fields. Each imprint field has the same pattern. FIG. 6B is a diagram illustrating one imprint field. A user defines how many samples to take of images along the edge. The imprint field shown in FIG. 6B includes 12 samples at 12 locations along the edge of the imprint field. Images are collected for multiple imprint fields at multiple locations. The defect analyzer software then processes all the images. FIG. 6C shows there is no defect at one location and FIG. 6D shows there is an extrusion defect at a location. The defect analyzer software identifies if and where defects exist in each image for every location sampled across all process conditions evaluated.

Figure 7A:
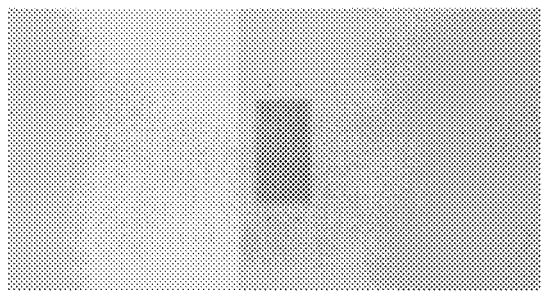
FIGS. 7A-7L are diagrams illustrating golden image examples of RLT edge template type and feature height edge template type according to one embodiment.
Figure 7B:
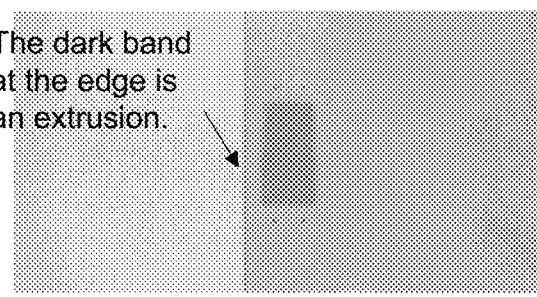
Figure 7C:
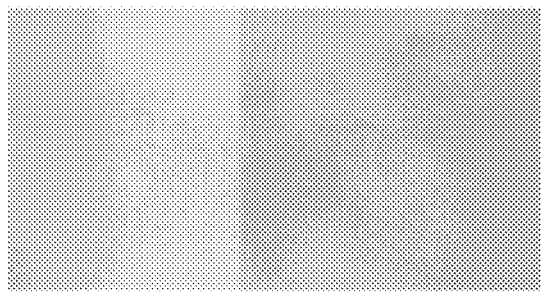
Figure 7D:
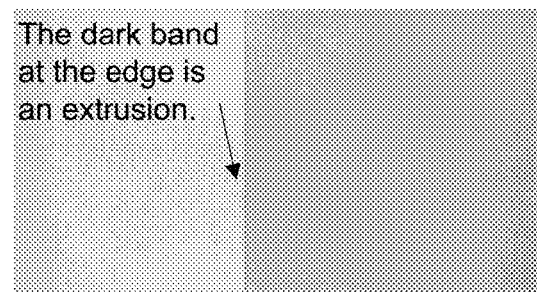
Figure 7E:
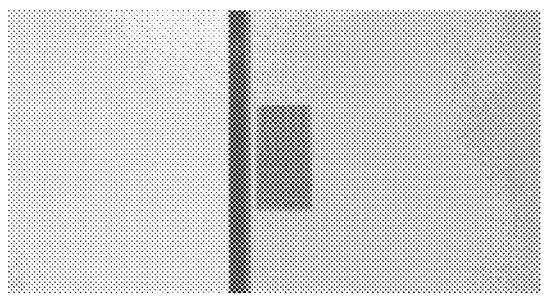
Figure 7F:
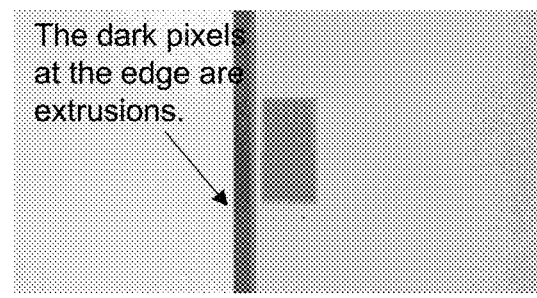
Figure 7G:
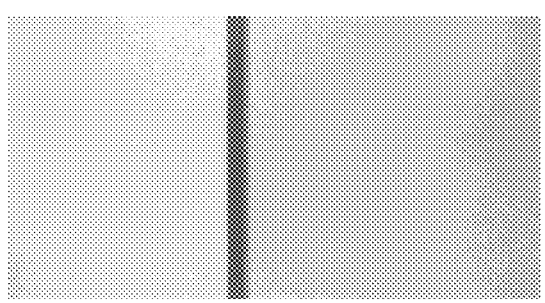
Figure 7H:
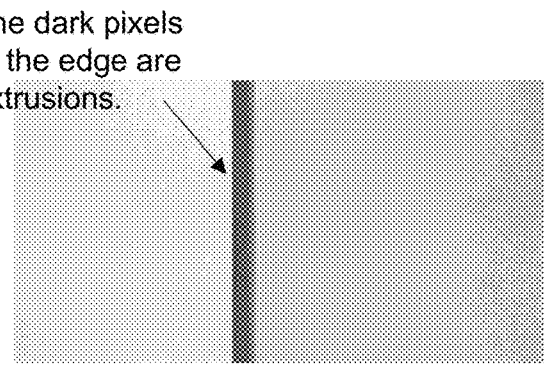
Figure 7I:
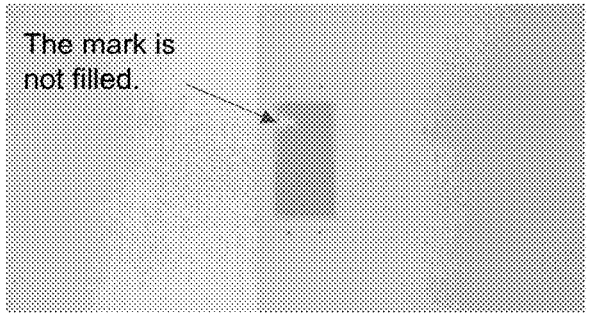
Figure 7J:
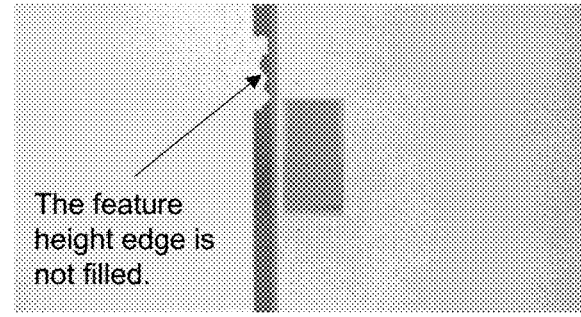
Figure 7K:
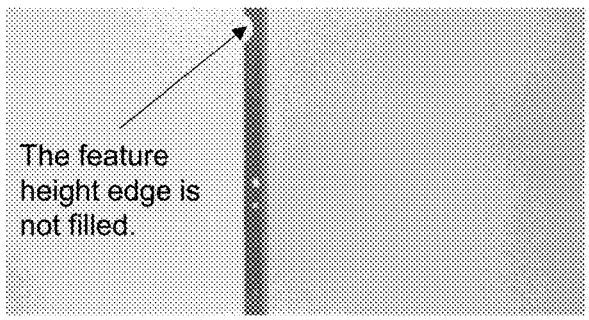
Figure 7L:
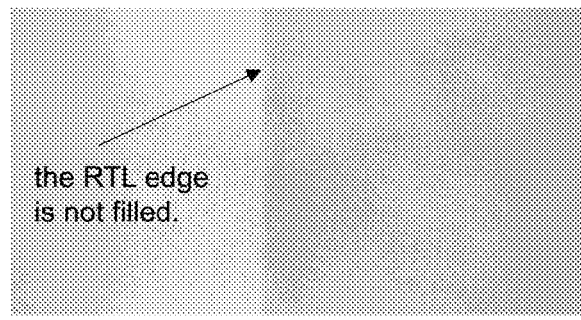

FIGS. 7A-7L are pictures illustrating both golden image examples and defect examples according to one embodiment. FIG. 7A illustrates an example of an RLT edge template type having a mark location. An RLT edge template type is a template that forms an imprint in which the intended thickness of the cured formable material at the edge of the imprint is substantially the same as the RLT 48 (for example $t_2$ illustrated in FIG. 3). FIG. 7B illustrates an example of the RLT edge template type including the dark band at the edge is an extrusion. FIG. 7C illustrates an example of the RLT edge template type having no mark location which may be used as a golden image. FIG. 7D illustrates an example of the RLT edge template type with no mark location showing the dark band at the edge is an extrusion. FIG. 7E illustrates an example of a Feature Height edge template type that has a mark location. A Feature Height edge template type is a template that forms an imprint in which the intended thickness of the cured formable material at the edge of the imprint is substantially the same as the tallest features formed in the pattern area of the template (for example $t_1$ illustrated in FIG. 3). FIG. 7F illustrates an example of the Feature Height edge mark having a mark location that shows the dark pixels at the edge are extrusions. FIG. 7G illustrates an example of a Feature Height edge template type having no mark location which may be used as a golden image. FIG. 7H illustrates an example of a Feature Height edge template type with no mark location showing the dark pixels at the edge are extrusions. FIG. 7I illustrates an example of an RLT Edge template type having a mark location where the mark is not filled, this is an example of a non-fill type defect. FIG. 7J illustrates an example of a Feature Height edge template type with a mark location where the feature height edge is not filled. FIG. 7K illustrates an example of a Feature Height edge template type without a mark location where the feature height edge is not filled. FIG. 7L illustrates an example of a simulated RLT edge template type with no mark location where the RLT edge is not filled.

Figure 8:
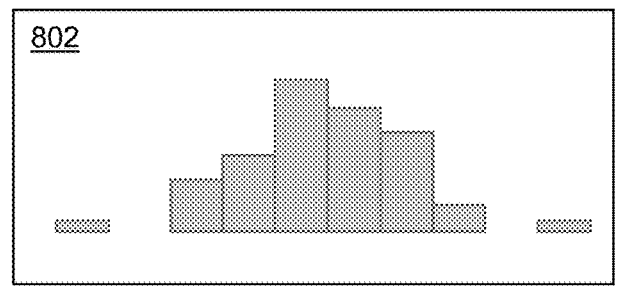
FIG. 8 are diagrams that are used to illustrate the meaning of an interquartile range as used in an embodiment.
Figure 8:
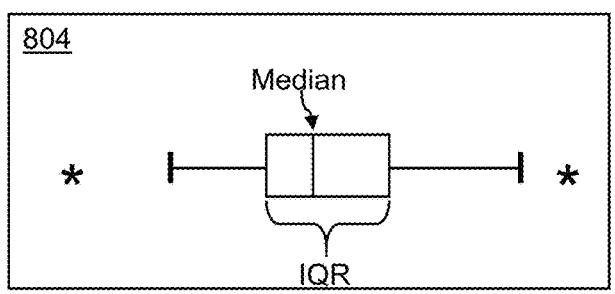

The process described below includes an evaluation of interquartile range according to one embodiment. The interquartile range is a statistical parameter that can be used to describe an aspect of a distribution. For example, given a set of data that represents a distribution of intensity values in a cropped image as illustrated in FIG. 8 as a histogram 802. This distribution may also be represented by a box plot 804 (also known as box and whisker diagram) shown in FIG. 8. The width of the box plot represents interquartile range. The interquartile range (IQR) represents a likely range of variation in values between a first quartile in the distribution and a third quartile in the distribution. The line in the middle of the box represents the median value. The box plot also shows fences which may be 1.5 times the IQR. Values outside the fences may be considered outliers.

Figure 9A:
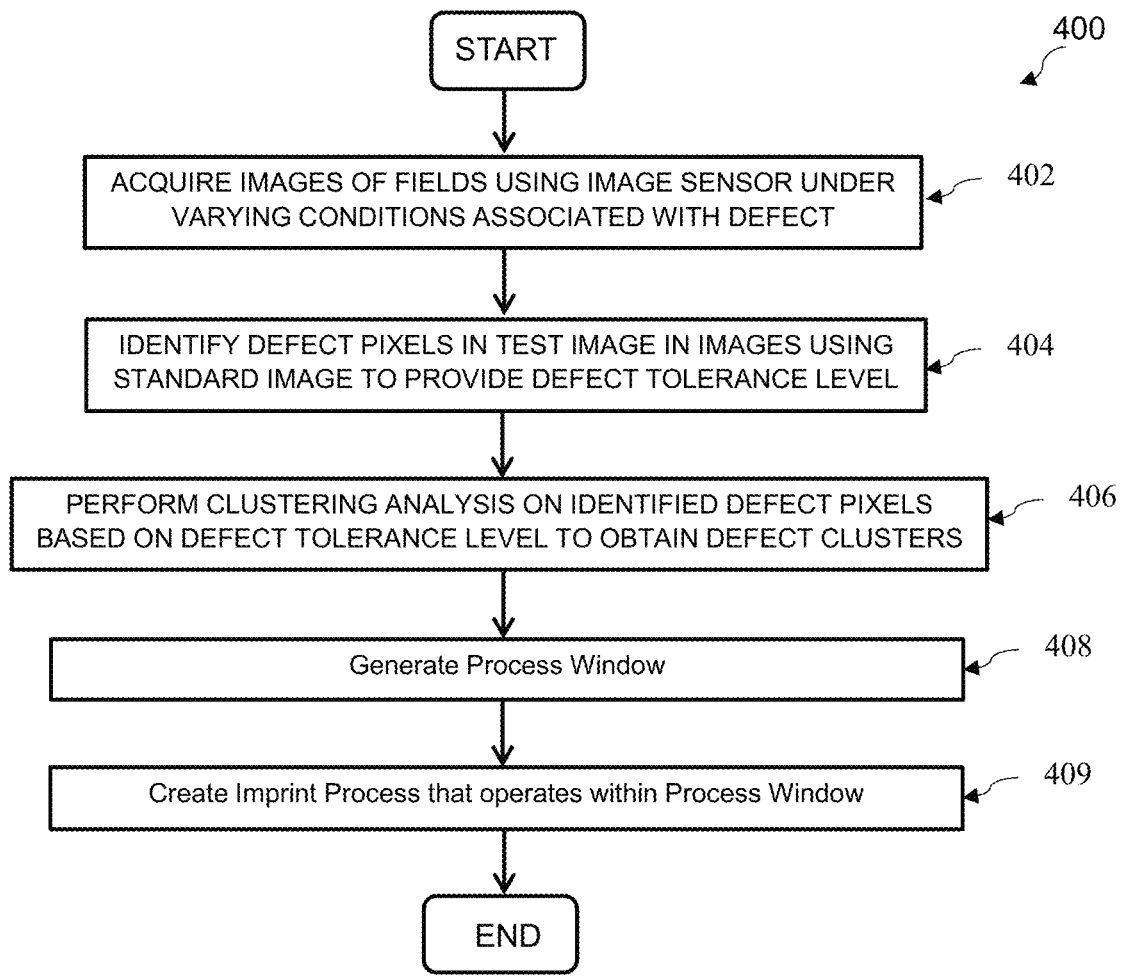
FIGS. 9A, 9B, and 9C are flowcharts illustrating a process for defect analysis according to one embodiment.
Figure 9B:
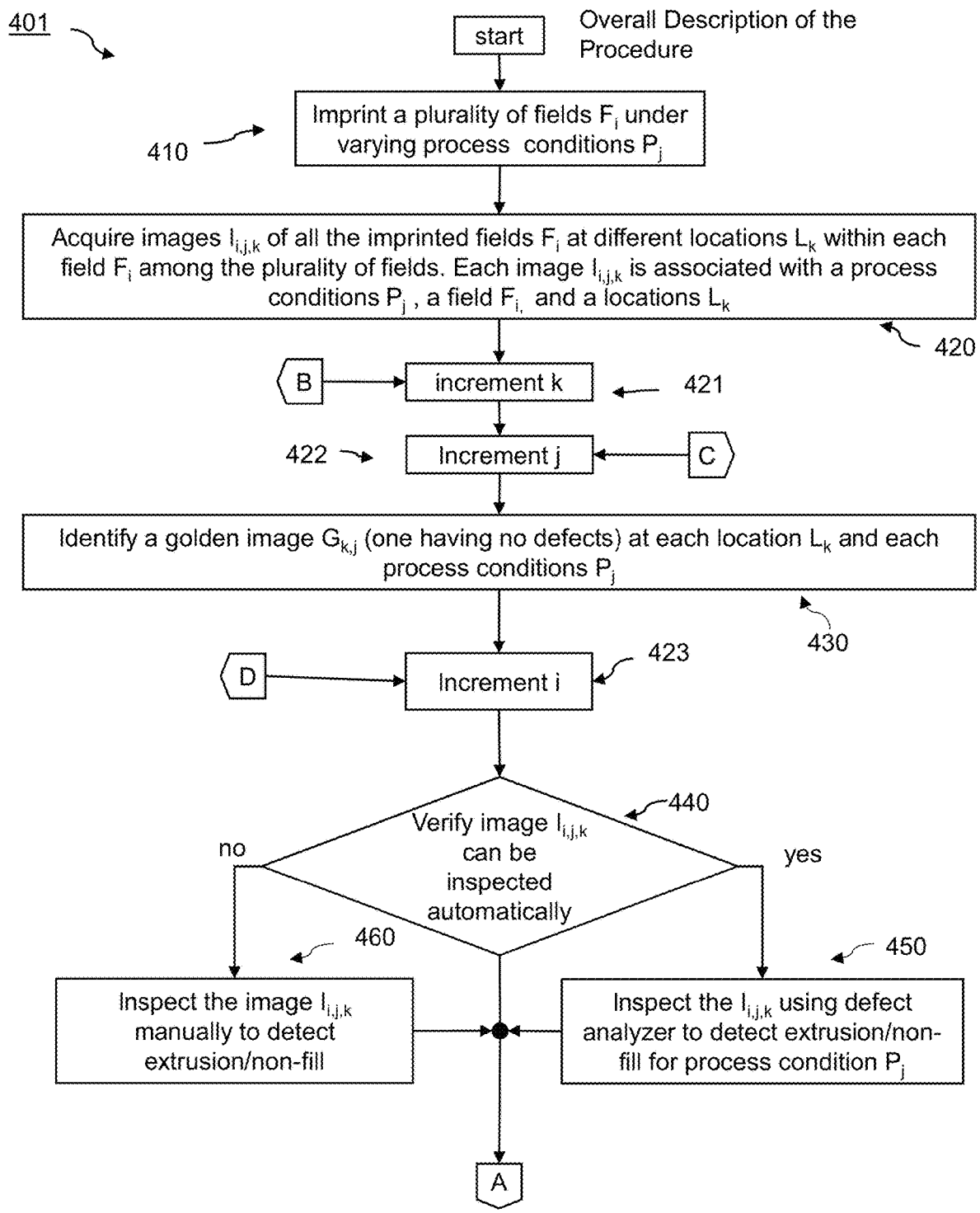
Figure 9C:
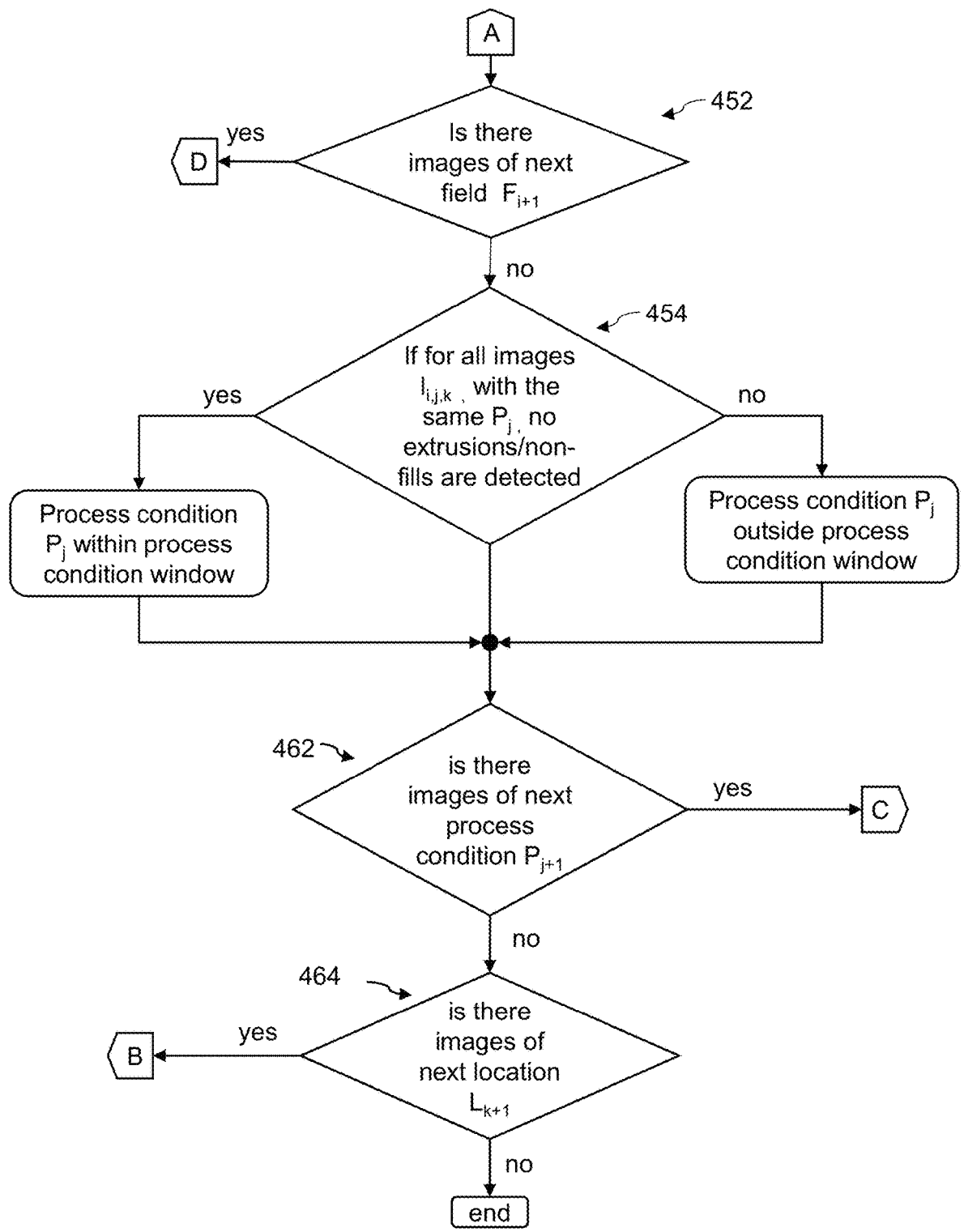

FIG. 9A is a flowchart illustrating a process 400 for defect analysis according to one embodiment. FIGS. 9B and 9C are flowcharts illustrating a process 401, a more details of process 400, for defect analysis according to one embodiment. FIG. 9A is an illustration of the overall process 400, details of which are provided in FIGS. 9B and 9C as process 401. The process 400 may include an acquiring step 402 in which the image sensor 120 is used to acquire a plurality of images at a plurality of locations at varying process conditions which are associated with defects in the results of an imprinting process. The process 400 may also include an identification step 404 in which defect pixels are identified in using a standard (golden image) which provides tolerance levels for identifying the defects. The process 400 may also include a clustering step 406 that performs clustering analysis on identified defect pixels based on the defect tolerance level. The process 400 may also include a generation step 408 of generating a process window based upon the results the clustering analysis and other steps described below. The process 400 may also include an imprinting process creation step 409 that may include the generation of an imprinting process or a portion of the imprinting process (such as DEE, or a dispense pattern) in accordance with the generated process window.

Upon START, the process 401 imprints a plurality of fields $F_i$ under varying process condition $P_j$ (Block 410). Varying process conditions may include but not limited to spread time, gas flow, uv curing, and drop pattern. It is necessary to find optimal values of these process conditions in order to eliminate defects. Next, the process 401 acquires images $I_{i,j,k}$ of all the imprinted fields $F_i$ at different locations $L_k$ within each field $F_i$ among the plurality of fields. Each image $I_{i,j,k}$ is associated with a process conditions $P_j$, a field $F_i$, and a locations $L_k$ (Block 420). Then process 401 performs increment k (Block 421) and increments j (Block 422). Process 401 continues to identifies a golden image $G_{k,j}$ (one having no defects) at each location $L_k$ and each process conditions $P_j$ (Block 430). In an alternative embodiment, a single $G_k$ is used for all process conditions $P_j$. Golden image is defined as image that has no defects. Next, process 401 increments i (Block 423). Process 401 then verifies whether image $I_{i,j,k}$ can be inspected automatically (Block 440). If YES, process 401 inspects the $I_{i,j,k}$ using defect analyzer to detect extrusion/non-fill for process condition $P_j$ (Block 450). If NO, process 401 inspects the image $I_{i,j,k}$ manually to detect extrusion/non-fill (Block 460). Process 401 then continues to determine whether there are any images of next field $F_{i+1}$ (Block 452). If YES, process 401 returns to Block 423. If NO, process 401 determines whether any extrusions/non-fills are detected for all images $I_{i,j,k}$ with the same $P_j$ (Block 454). If YES, process 401 processes condition $P_j$ outside process condition window (Block 455). If NO, process 401 processes condition $P_j$ process condition window (Block 455). If NO, process 401 processes condition $P_j$ within process condition window (Block 457). Next process 401 determines on whether there is image of next process condition $P_{j+1}$ (Block 462). If there is image of next process condition $P_{j+1}$, process 401 returns to Block 422. If there is no image of next process condition $P_{j+1}$, process 401 then determines whether there is any image of the next location $L_{k+1}$ (Block 464). If YES, process 401 returns to Block 421. If NO, process 401 is terminated.

Figure 10A:
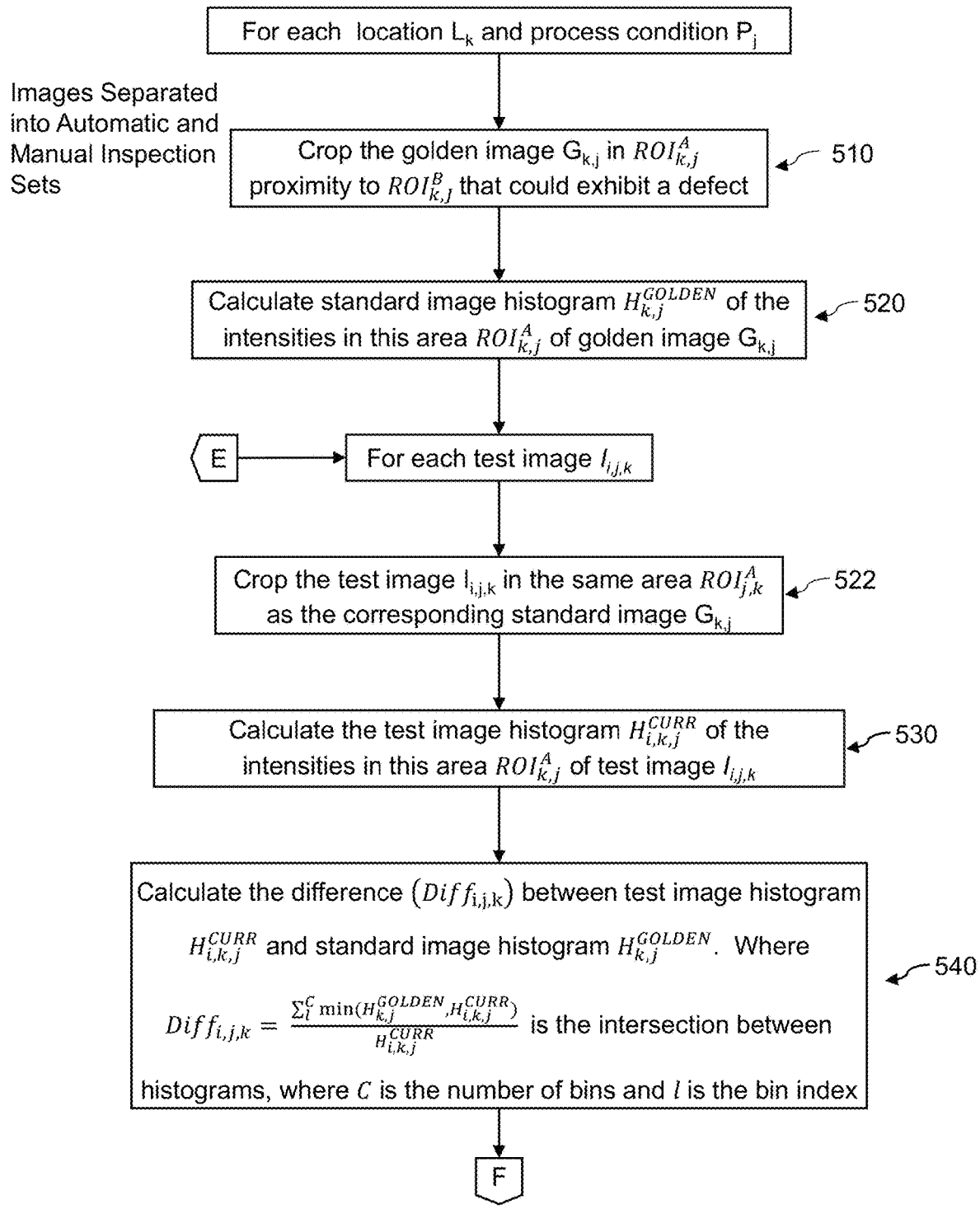
FIGS. 10A and 10B is a flowchart illustrating a process for verifying image is to be inspected automatically.
Figure 10B:
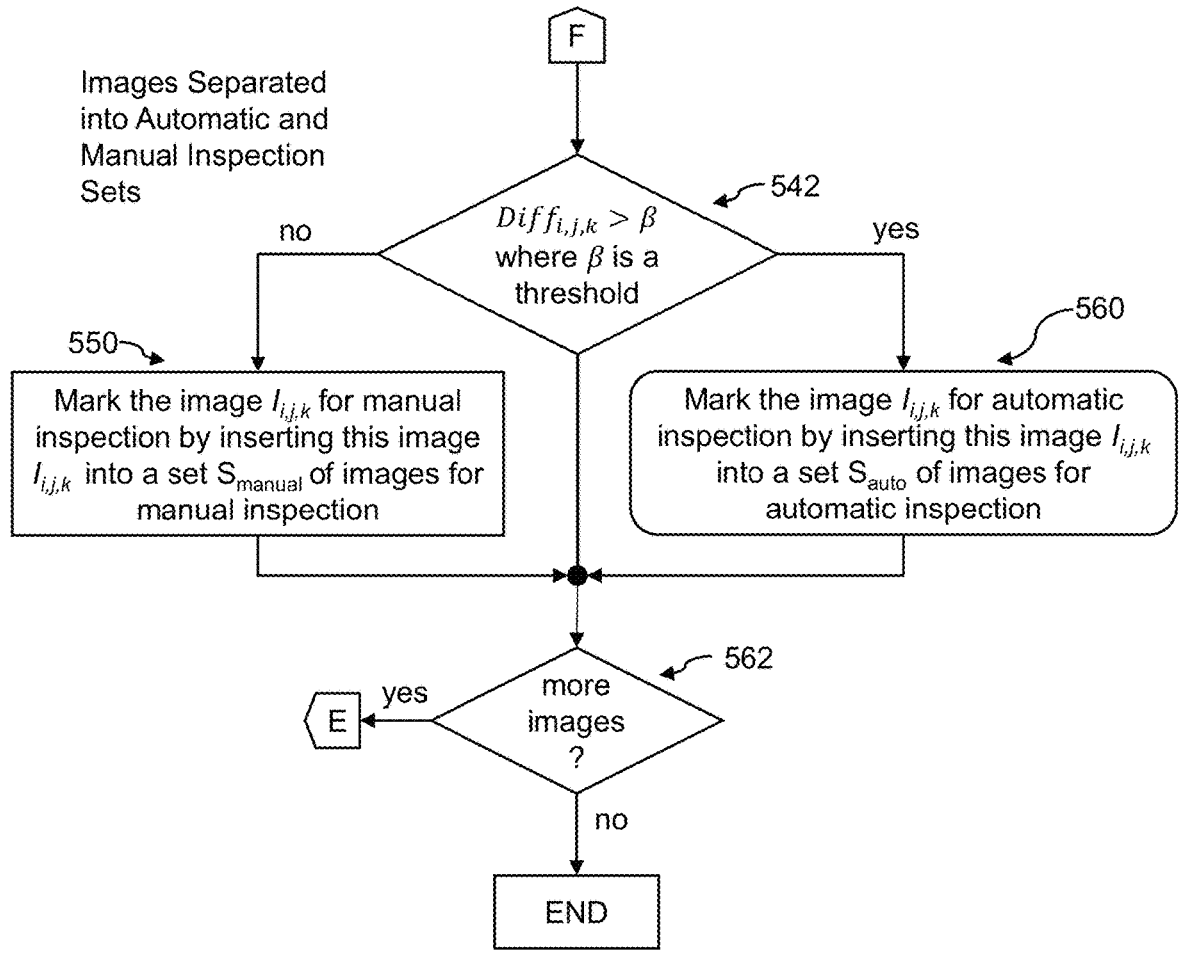

FIGS. 10A and 10B is a flowchart illustrating a process 440 for verifying that image $I_{i,j,k}$ can be inspected automatically for each location $L_k$ and process condition $P_j$.

Upon START, the process 440 crops the golden image $G_{k,j}$ in $ROI_{k,j}^A$ proximity to $ROI_{k,j}^B$ that could exhibit a defect (Block 510). Process 440 then calculates standard image histogram $H_{k,j}^{GOLDEN}$ of the intensities for area $ROI_{k,j}^A$ of the golden image $G_{k,j}$ (Block 520). The process 440 continues, for each test image $I_{i,j,k}$, process 440 crops the test image $I_{i,j,k}$ in the same area $ROI_{k,j}^A$ as the corresponding standard image $G_{k,j}$ (Block 522). Next, process 440 calculates the test image histogram $H_{i,k,j}^{CURR}$ of the intensities in the area $ROI_{k,j}^A$ of test image $I_{i,j,k}$ (Block 530) and calculates the difference ($Diff_{i,j,k}$) between test image histogram $H_{i,k,j}^{CURR}$ and standard image histogram $H_{k,j}^{GOLDEN}$. Formula (1) below may be used to calculate $Diff_{i,j,k}$.

$$Diff_{i,j,k} = \frac{\sum_{l}^{C} \min(H_{k,j}^{GOLDEN}, H_{i,k,j}^{CURR})}{H_{i,k,j}^{CURR}} \quad 1$$

Wherein $Diff_{i,j,k}$ is representative of the intersection between two histograms, where C is the number of bins and l is the bin index (Block 540). Process 440 then determines whether $Diff_{i,j,k} < \beta$ where $\beta$ is a threshold (Block 542) where $\beta$ is a real number. In one embodiment, $\beta=4.5$. If $Diff_{i,j,k} > \beta$, then process 440 marks the image $I_{i,j,k}$ for automatic inspection by inserting this image $I_{i,j,k}$ into a set $S_{auto}$ of images for automatic inspection (Block 560). If not, process 440 marks the image $I_{i,j,k}$ for manual inspection by inserting this image $I_{i,j,k}$ into a set $S_{manual}$ of images for manual inspection (Block 550). Process 440 then checks to see whether there are more images (Block 562). If there are more images, process 440 then returns to Block 522. Otherwise, the process 440 is then terminated.

Figure 11:
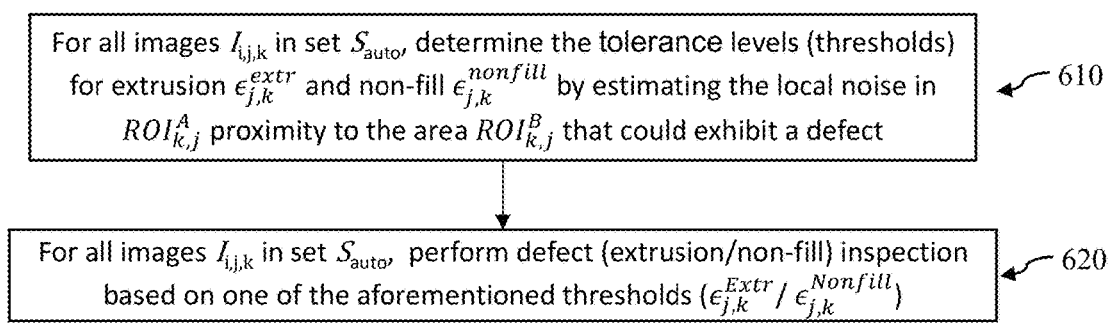
FIG. 11 is a flowchart illustrating a process for detecting extrusion/non-fill for a process condition.

FIG. 11 is a flowchart illustrating a process 450 for inspecting the $I_{i,j,k}$ using defect analyzer to detect extrusion/non-fill for process condition $P_j$.

Upon START, for all images $I_{i,j,k}$ in set $S_{auto}$, process 450 determines the tolerance levels (thresholds) for extrusion $\epsilon_{j,k}^{extr}$ and non-fill $\epsilon_{j,k}^{nonfill}$ by estimating the local noise in $ROI_{k,j}^A$ proximity to the area $ROI_{k,j}^B$ that could exhibit a defect (Block 610). Next, for all images $I_{i,j,k}$ in set $S_{auto}$, process 450 performs defect (extrusion/non-fill) inspection based on one of the aforementioned thresholds ($\epsilon_{j,k}^{Extr}/\epsilon_{j,k}^{Nonfill}$) (Block 620). Process 450 is then terminated.

In one embodiment, thresholds $\epsilon_k^{extr}$ and $\epsilon_k^{nonfill}$ (Process 450) are constant across all process conditions $P_j$.

Figure 12A:
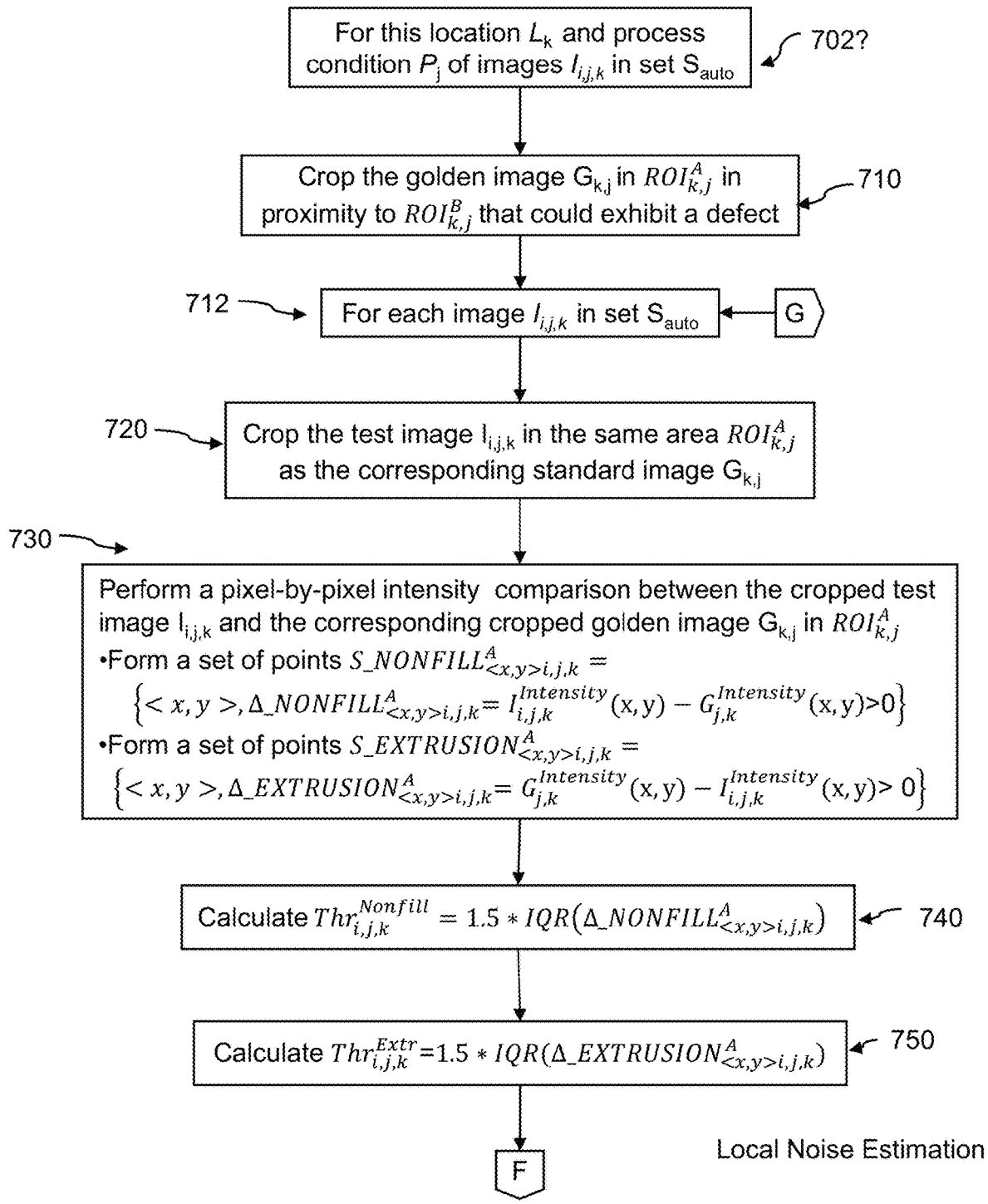
FIGS. 12A and 12B is a flowchart illustrating a process for estimating local noise.
Figure 12B:
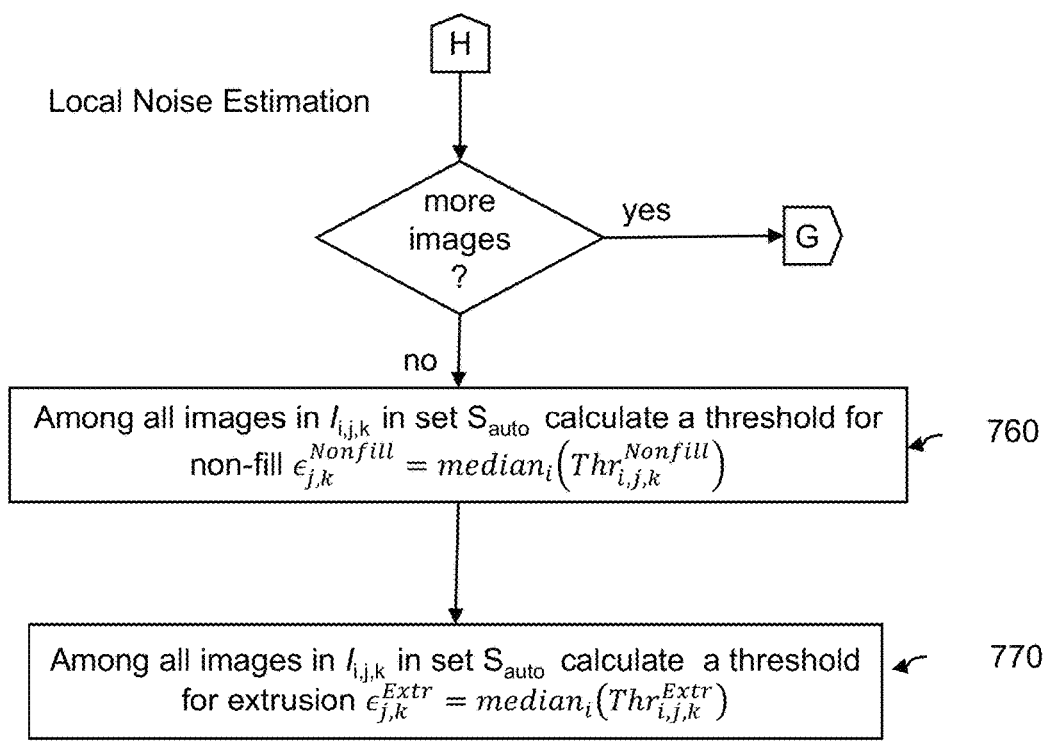

FIGS. 12A and 12B is a flowchart illustrating a process 610 for determining the tolerance levels (thresholds) $T_{i,j,k}$ for extrusion and non-fill.

Upon START, for location $L_k$ and process condition $P_j$ of images $I_{i,j,k}$ in set $S_{auto}$, the process 610 crops the golden image $G_{k,j}$ in $ROI_{k,j}^A$ in proximity to $ROI_{k,j}^B$ that could exhibit a defect (Block 710). For each image $I_{i,j,k}$ in set $S_{auto}$ (Block 712), process 610 crops the test image $I_{i,j,k}$ in the same area $ROI_{k,j}^A$ as the corresponding standard image $G_{k,j}$ (Block 720). Next, process 610 performs a pixel-by-pixel comparison between the cropped test image $I_{i,j,k}$ and the corresponding cropped golden image $G_{k,j}$ in $ROI_{k,j}^A$ including forming a set of points $S\_NONFILL_{<x,y>i,j,k}^A$ described in equation (2) below and a set of points $S\_EXTRUSiON_{<x,y>i,j,k}^A$ described in equations (3) below (block 730).

$$S\_NONFILL_{(x,y)i,j,k}^A = \left\{ \begin{array}{l} \langle x, y \rangle, \Delta\_NONFILL_{(x,y)i,j,k}^A = \\ I_{i,j,k}^{Intensity}(x,y) - G_{j,k}^{Intensity}(x,y) > 0 \end{array} \right\} \quad 2$$

$$S\_EXTRUSION_{(x,y)i,j,k}^A = \left\{ \begin{array}{l} \langle x, y \rangle, \Delta\_EXTRUSION_{(x,y)i,j,k}^A = \\ G_{j,k}^{Intensity}(x,y) - I_{i,j,k}^{Intensity}(x,y) > 0 \end{array} \right\} \quad 3$$

The process 610 then calculates $Thr_{i,j,k}^{Nonfill}$ which is defined in equation (4) (Block 740) and $Thr_{i,j,k}^{Extr}$ which is defined in equation (5) (Block 750). Wherein IQR is the interquartile range of the set as described above with reference to FIG. 8. Next, the process 610 determines whether or not there are more images (Block 755). If YES, the process 610 returns to Block 712. Otherwise, among all images in $I_{i,j,k}$ in set $S_{auto}$, the process 610 calculates a threshold for non-fill $\epsilon_{j,k}^{Nonfill}$ as described in equation (6) below (Block 760) and calculates a threshold for extrusion $\epsilon_{j,k}^{Extr}$ as described in equation (7) below (Block 770). The process 610 is then terminated. When calculating $Thr_{i,j,k}^{Nonfill}$ (Block 740), all values in $\Delta\_NONFILL_{<x,y>i,j,k}^A$ above $Thr_{i,j,k}^{Nonfill}$ are considered outliers. Wherein outliers are values that are considered outside the overall pattern of distribution.

$$Thr_{i,j,k}^{Nonfill} = 1.5*IQR(\Delta\_NONFILL_{<x,y>i,j,k}^A) \quad 4$$

$$Thr_{i,j,k}^{Extr} = 1.5*IQR(\Delta\_EXTRUSION_{<x,y>i,j,k}^A) \quad 5$$

$$\epsilon_{j,k}^{Nonfill} = \text{median}_i(Thr_{i,j,k}^{Nonfill}) \quad 6$$

$$\epsilon_{j,k}^{Extr} = \text{median}_i(Thr_{i,j,k}^{Extr}) \quad 7$$

Figure 13A:
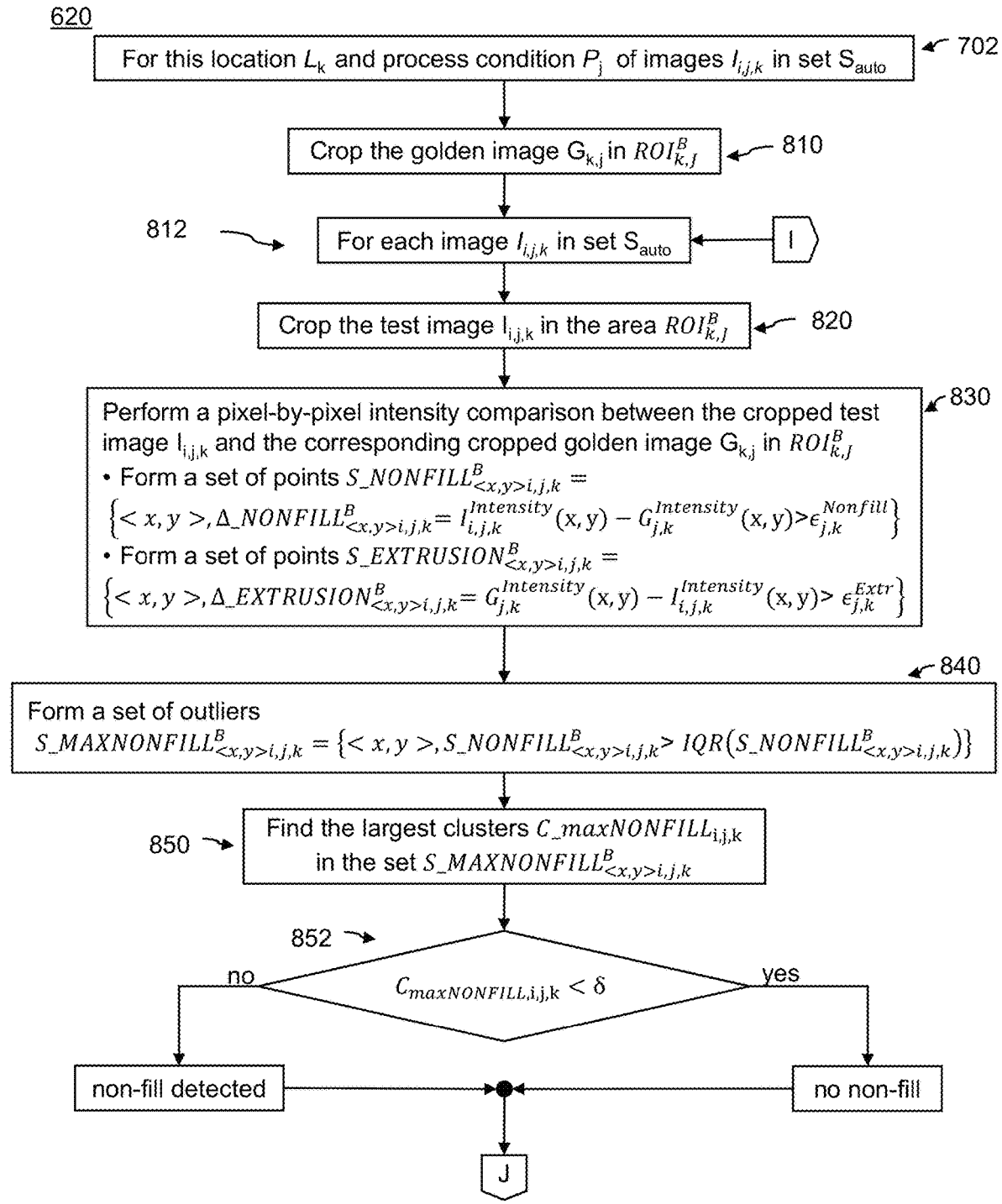
FIGS. 13A and 13B is a flowchart illustrating a process for inspecting defect.
Figure 13B:
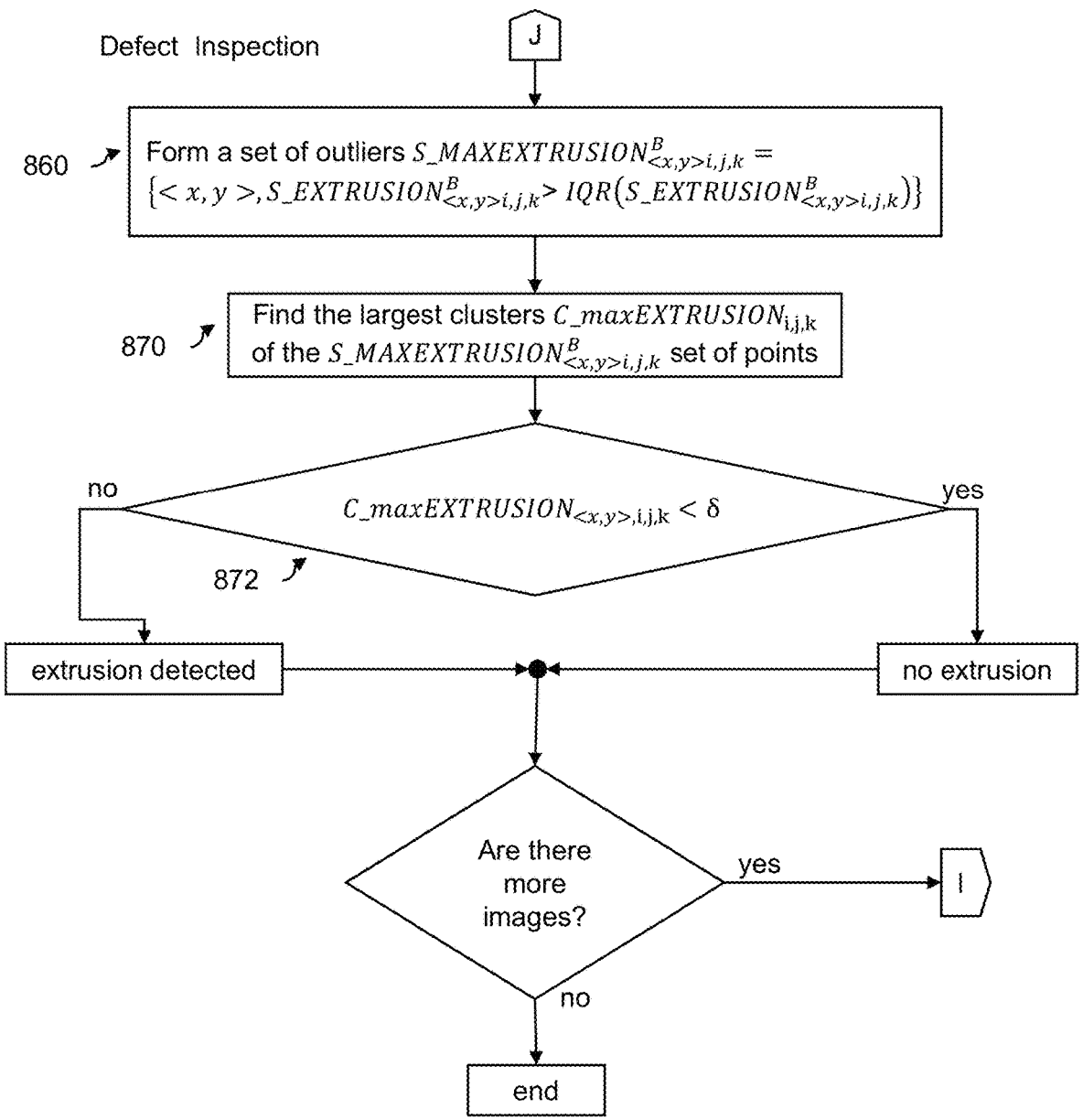

FIGS. 13A and 13B are flowcharts illustrating a process 620 for performing defect (extrusion/non-fill) inspection for all images $I_{i,j,k}$ in set $S_{auto}$.

Upon START, for location $L_k$ and process condition $P_j$ of images $I_{i,j,k}$ in set $S_{auto}$ (Block 702), the process 620 crops the golden image $G_k$ in $ROI_{k,j}^B$ (Block 810). Next, for each image $I_{i,j,k}$ in set $S_{auto}$ (Block 812), the process 620 crops the test image $I_{i,j,k}$ in the area $ROI_{k,J}$ (Block 820). Next, the process 620 performs a pixel-by-pixel comparison between the cropped test image $I_{i,j,k}$ and the corresponding cropped golden image $G_{k,j}$ in $ROI_{k,J}^B$. Based upon the comparison two sets of points are formed $S\_NONFILL_{<x,y>i,j,k}^B$ which meets the conditions described by equation (8) and $S\_EXTRUSION_{<x,y>i,j,k}^B$ which meet the conditions described in equation (9) (Block 830).

$$S\_NONFILL_{(x,y)i,j,k}^B = \left\{ \begin{array}{l} \langle x, y \rangle, \Delta\_NONFILL_{(x,y)i,j,k}^B = \\ I_{i,j,k}^{Intensity}(x,y) - G_{j,k}^{Intensity}(x,y) > \epsilon_{j,k}^{Nonfill} \end{array} \right\} \quad 8$$

$$S\_EXTRUSION_{(x,y)i,j,k}^B = \left\{ \begin{array}{l} \langle x, y \rangle, \Delta\_EXTRUSION_{(x,y)i,j,k}^B = \\ G_{j,k}^{Intensity}(x,y) - I_{i,j,k}^{Intensity}(x,y) > \epsilon_{j,k}^{Extr} \end{array} \right\} \quad 9$$

The process 620 then forms a set of outliers $S\_MAXNONFILL_{<x,y>i,j,k}^B$ which meet the criteria described in equation (10) below (Block 840).

$$S\_MAXNONFILL_{(x,y)i,j,k}^B = \\ \left\{ \begin{array}{l} \langle x, y \rangle, \\ S\_NONFILL_{(x,y)i,j,k}^B > IQR(S\_NONFILL_{(x,y)i,j,k}^B) \end{array} \right\} \quad 10$$

The process 620 continues to perform clustering analysis of $<x,y>$ pixels, corresponding to outliers and to find the largest clusters $C\_maxNONFILL_{i,j,k}$ in the set $S\_MAXNONFILL_{<x,y>i,j,k}^B$ (Block 850). The clustering analysis may be performed using any of a number of well-known clustering methods. One such clustering method is described in Donald G. BAILEY, Christopher T. JOHNSTON, Ni MA, Connected Components Analysis of Streamed Images, 2008 International Conference on Field Programmable Logic and Applications, Sep. 8, 2008, pages 679-682, IEEE, Piscataway, N.J., 2008. The process 620 then determines whether C_maxNONFILL$_{i,j,k}$<δ. If YES, then there is no non-fill. If NO, then non-filled is detected. The process 620 then forms a set of outliers S_MAXEXTRUSION$_{<x,y>i,j,k}^B$ defined in equation (11) below (Block 860).

$$S\_MAXEXTRUSION_{\langle x,y\rangle i,j,k}^B =$$
$$\left\{ \begin{array}{c} \langle x, y\rangle, \\ S\_EXTRUSION_{\langle x,y\rangle i,j,k}^B > IQR(S\_EXTRUSION_{\langle x,y\rangle i,j,k}^B) \end{array} \right\}$$

Next, the process 620 performs clustering analysis (using the same algorithm as above) and finds the largest clusters C_maxEXTRUSION$_{i,j,k}$ of the S_MAXEXTRUSION$_{<x,y>i,j,k}^B$ set of points (Block 870). The process 620 then determines on whether C_maxEXTRUSION$_{<x,y>i,j,k}$<δ (Block 872) where δ is a positive integer. In one embodiment, δ=3. For the test C_maxEXTRUSION$_{<X,Y>i,j,k}$<δ, if YES, it is concluded that there is no extrusion. If NO, it is concluded that extrusion is detected. The process 620 then checks to see whether there are more images (Block 875). If there are more images, the process 620 returns to Block 812. If there is no more image, the process 620 is then terminated.

Figure 14A:
FIG. 14A is a figure illustrating the cropping of a standard/test image, in proximity to the area that could exhibit a defect.

FIG. 14A is illustrating a cropped golden image G$_{k,j}$ or a cropped test image I$_{i,j,k}$ in a ROI$_{k,j}^A$ which would not exhibit a defect but is in proximity to ROI$_{k,j}^B$ that could exhibit a defect.

Figure 14B:
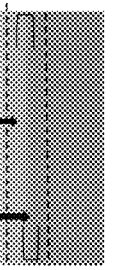
FIG. 14B is a figure illustrating a standard and test images in proximity of a defect area for cropping.

FIG. 14B is illustrating a process 720 of cropping a golden image (G$_{k,j}$) or a test image (I$_{i,j,k}$) around the area (ROI$_{k,j}^B$) that could exhibit a defect.

Figure 14C:
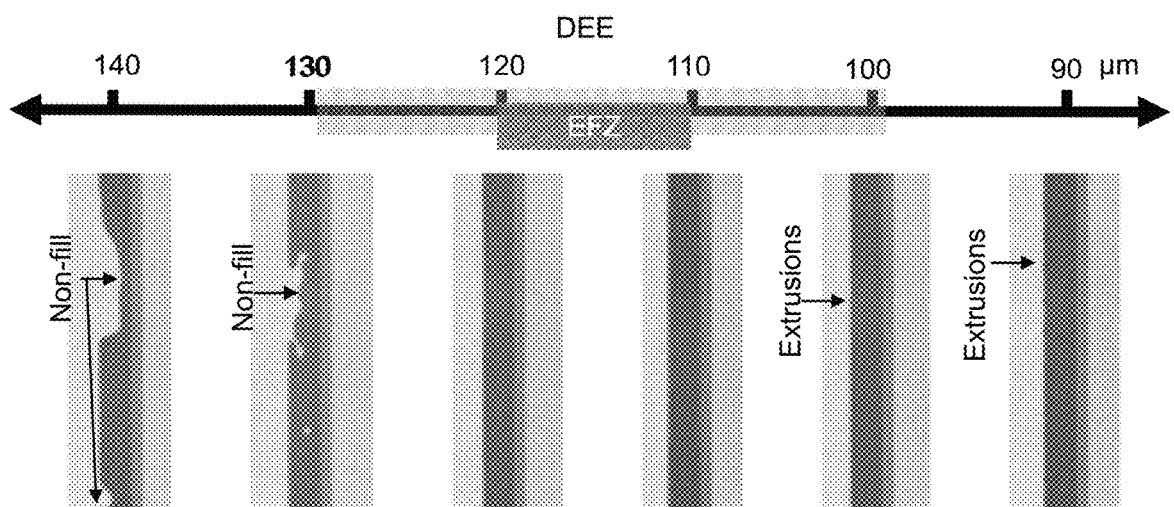
FIG. 14C is a diagram illustrating the Extrusion Free Zone (EFZ) to identify the process condition window.

FIG. 14C is an illustration of representative images showing different DEE values. The DEE and the filling result for each value is used to calculate the following parameters that define the "Extrusion Free Zone" (EFZ). The term EFZ is used to identify the process condition window. The drop edge exclusion (DEE) and the filing result for each value is used to calculate the following parameters that define the EFZ.

Extrusion Free Zone (EFZ)
Zone Maximum: (DEE$_{non-fill}$−DEE$_{Extrusion}$)
Zone Minimum: (DEE$_{Filled\ Max}$−DEE$_{Filled\ Min}$)

$$EFZ = \frac{Zone\ Max + Zone\ Min}{2} = Zone\ Max - Increment$$

FIG. 14C is a diagram illustrating the Extrusion Free Zone to identify the process condition window. In one embodiment, the DEE$_{non-fill}$ is 130, the DEE$_{Extrusion}$ is 100, the DEE$_{Filled\ Max}$ is 120, the DEE$_{Filled\ Min}$ is 110. Based on the above condition, the calculation for the Zone Maximum is 30 and the Zone Minimum is 10. Therefore, the EFZ is 20 μm.

Figure 15:
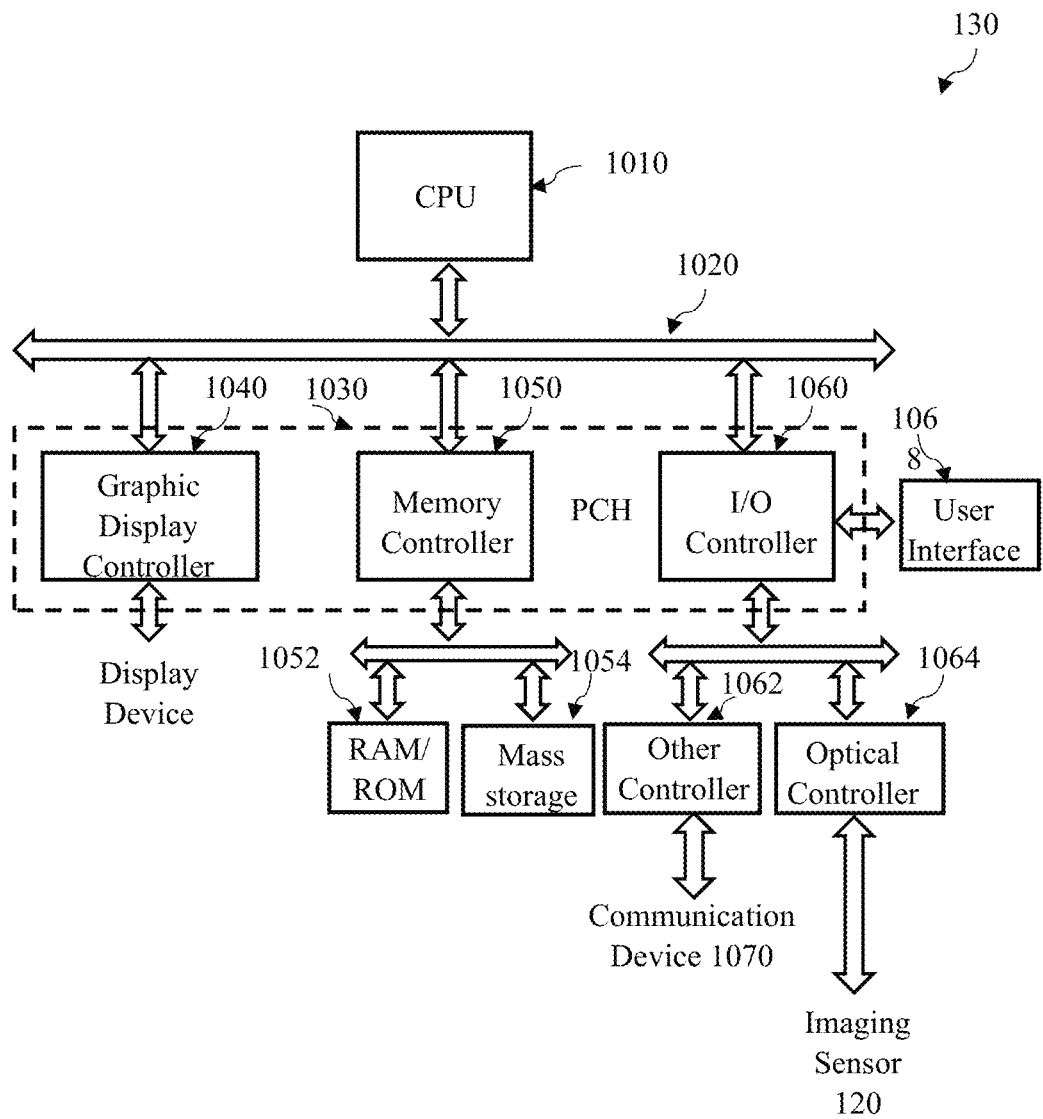
FIG. 15 is a diagram illustrating the defect analyzer 130 for nanoimprint lithography.

FIG. 15 is a diagram illustrating the defect analyzer 130 for nanoimprint lithography.

The system or defect analyzer 130 includes a central processing unit (CPU) or a processor 1010, a platform controller hub (PCH) 1030, and a bus 1020. The PCH 1030 may include a graphic display controller (GDC) 1040, a memory controller 1050, an input/output (I/O) controller 1060, and a mass storage controller 1054. The defect analyzer 130 may include more or less than the above components. In addition, a component may be integrated into another component. As shown in FIG. 15, all the controllers 1040, 1050, and 1060 are integrated in the PCH 1030. The integration may be partial and/or overlapped. For example, the GDC 1040 may be integrated into the CPU 1010, the I/O controller 1060 and the memory controller 1050 may be integrated into one single controller, etc.

The CPU or processor 1010 is a programmable device that may execute a program or a collection of instructions to carry out a task. It may be a general-purpose processor, a digital signal processor, a microcontroller, or a specially designed processor such as one design from Applications Specific Integrated Circuit (ASIC). It may include a single core or multiple cores. Each core may have multi-way multi-threading. The CPU 910 may have simultaneous multithreading feature to further exploit the parallelism due to multiple threads across the multiple cores. In addition, the CPU 1010 may have internal caches at multiple levels.

The bus 1020 may be any suitable bus connecting the CPU 1010 to other devices, including the PCH 1030. For example, the bus 1020 may be a Direct Media Interface (DMI).

The PCH 1030 in a highly integrated chipset that includes many functionalities to provide interface to several devices such as memory devices, input/output devices, storage devices, network devices, etc.

The I/O controller 1060 controls input devices (e.g., stylus, keyboard, and mouse, microphone, image sensor) and output devices (e.g., audio devices, speaker, scanner, and printer). It also has interface to a network interface card which provides interface to a network and wireless controller (not shown).

The memory controller 1050 controls memory devices such as the random access memory (RAM) and/or the read-only memory (ROM) 1052, and other types of memory such as the cache memory and flash memory. The RAM 1052 may store instructions or programs, loaded from a mass storage device, that, when executed by the CPU 1010, cause the CPU 1010 to perform operations as described above. It may also store data used in the operations. The ROM 1052 may include instructions, programs, constants, or data that are maintained whether it is powered or not.

The GDC 1040 controls a display device and provides graphical operations. It may be integrated inside the CPU 1010. It typically has a graphical user interface (GUI) to allow interactions with a user (e.g., user 140 in FIG. 1) who may send a command or activate a function. The GDC 1040 may display, on the display device, images of the imprinted fields of the nanoimprint lithography.

The mass storage controller 1054 controls the mass storage devices such as CD-ROM and hard disk.

The I/O controller 1060 may include another controller 1062 and an optical controller 1064. The other controller 1062 may be an input/output controller or any controller that can control a communication device 1070 or any other peripheral devices. The optical controller 1064 performs control functions related to the optical components, such as an imaging sensor 120, a camera, etc.

Additional devices or bus interfaces may be available for interconnections and/or expansion. Some examples may include the Peripheral Component Interconnect Express (PCIe) bus, the Universal Serial Bus (USB), etc.

All or part of an embodiment may be implemented by various means depending on applications according to particular features, functions. These means may include hardware, software, or firmware, or any combination thereof. A hardware, software, or firmware element may have several modules coupled to one another. A hardware module is coupled to another module by mechanical, electrical, optical, electromagnetic or any physical connections. A software module is coupled to another module by a function, procedure, method, subprogram, or subroutine call, a jump, a link, a parameter, variable, and argument passing, a function return, etc. A software module is coupled to another module to receive variables, parameters, arguments, pointers, etc. and/or to generate or pass results, updated variables, pointers, etc. A firmware module is coupled to another module by any combination of hardware and software coupling methods above. A hardware, software, or firmware module may be coupled to any one of another hardware, software, or firmware module. A module may also be a software driver or interface to interact with the operating system running on the platform. A module may also be a hardware driver to configure, set up, initialize, send and receive data to and from a hardware device. An apparatus may include any combination of hardware, software, and firmware modules.

A manufacturing method of a device (a semiconductor device, a magnetic storage media, a liquid crystal display element, or the like) serving as an article will be described. The manufacturing method includes a step of forming a pattern on a substrate (a wafer, a glass plate, a film-like substrate, or the like) using an imprint apparatus or imprint method described above. The manufacturing method further includes a step of processing the substrate on which the pattern has been formed. The processing step can include a step of removing the residual film of the pattern. The processing step can also include another known step such as a step of etching the substrate using the pattern as a mask. The method of manufacturing the article according to this embodiment is superior to a conventional method in at least one of the performance, quality, productivity, and production cost of the article.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. An apparatus comprising:
a processor; and
a memory containing instructions that, when executed by the processor, cause the processor to perform operations comprising:
acquiring a plurality of images of a plurality of imprinted fields using an image sensor under varying process conditions associated with a defect,
identifying defect pixels in a test image in the plurality of images using a standard image to provide a defect tolerance, the standard image having no defects,
performing clustering analysis on the identified defect pixels based on the defect tolerance level to obtain defect clusters,
generating a process window based on the defect clusters, and
creating an imprint process according to the process window,
wherein the identifying defect pixels comprises:
obtaining N pixel intensities of N pixels at pixel locations in an area of the test image,
determining N differences between the N pixel intensities and N standard intensities at standard locations in the standard image, and
determining the defect tolerance level of M defective pixels in the N pixels,
wherein M≤N and M and N are positive integer.

2. The apparatus according to claim 1, wherein acquiring a plurality of images comprises:
imprinting a plurality of fields on a substrate under the varying process conditions; and
obtaining the plurality of images by taking optical snapshots of the plurality of imprinted fields having at least same process condition at different locations along field edges for different fields.

3. The apparatus according to claim 1, wherein identifying defect pixels comprises:
classifying the N pixels as defective or non-defective pixels based on the corresponding N differences
wherein the standard locations correspond to the pixel locations in the standard image.

4. The apparatus according to claim 1, wherein performing clustering analysis comprises:
obtaining an area in the test image;
obtaining N pixel intensities of N pixels at pixel locations in the area;
determining N differences between the N pixel intensities and N standard intensities at standard locations in the standard image, the standard locations corresponding to the pixel locations in the standard image;
obtaining the defect clusters of defect pixels based on the N differences and the defect tolerance level, the clusters having respective cluster sizes.

5. The apparatus according to claim 1, wherein generating the process window comprises:
forming clusters by performing connectivity analysis on the defect clusters to obtain sizes of the defect clusters;
determining a largest value of the sizes of the defect clusters; and
determining whether the test image has a defect based on the largest value.

6. The apparatus according to claim 5, wherein the defect is one of a non-fill defect and an extrusion defect.

7. The apparatus according to claim 6, wherein creating the imprint process includes creating a drop pattern, wherein creating the drop pattern comprises:
obtaining a range of drop exclusion zones for the non-fill and extrusion defects using the sizes of the defect clusters and distances to drop edge exclusion; and
creating the drop pattern using the range of drop exclusion zones.

8. The apparatus according to claim 1, wherein determining the defect tolerance level comprises:
calculating the defect tolerance level as a median of the M defective pixels.

9. A method comprising:
acquiring a plurality of images of a plurality of imprinted fields using an image sensor under varying process conditions associated with a defect,
identifying defect pixels in a test image in the plurality of images using a standard image to provide a defect tolerance level, the standard image having no defects, performing clustering analysis on the identified defect pixels based on the defect tolerance level to obtain defect clusters, generate a process window based on the defect clusters, and creating an imprint process according to the process window, wherein the identifying defect pixels comprises:

obtaining N pixel intensities of N pixels at pixel locations in an area of the test image, determining N differences between the N pixel intensities and N standard intensities at standard locations in the standard image, and determining the defect tolerance level of M defective pixels in the N pixels, wherein M≤N and M and N are positive integer.

10. The method according to claim 9, wherein acquiring a plurality of images comprises:

imprinting a plurality of fields on a substrate under the varying process conditions; and obtaining the plurality of images by taking optical snapshots of the plurality of imprinted fields having at least same process condition at different locations along field edges for different fields.

11. The method according to claim 9, wherein identifying defect pixels comprises:

classifying the N pixels as defective or non-defective pixels based on the corresponding N differences, wherein the standard locations correspond to the pixel locations in the standard image.

12. The method according to claim 9, wherein performing clustering analysis comprises:

obtaining an area in the test image;

obtaining N pixel intensities of N pixels at pixel locations in the area;

determining N differences between the N pixel intensities and N standard intensities at standard locations in the standard image, the standard locations corresponding to the pixel locations in the standard image;

obtaining the defect clusters of defect pixels based on the N differences and the defect tolerance level, the clusters having respective cluster sizes.

13. The method according to claim 9, wherein generating process window comprises:

performing connectivity analysis on the defect clusters to obtain sizes of the defect clusters;

determining a largest value of the sizes of the defect clusters; and determining whether the test image has a defect based on the largest value.

14. The method according to claim 13, wherein the defect is one of a non-fill defect and an extrusion defect.

15. The method according to claim 14, wherein creating the imprint process includes creating a drop pattern, wherein creating the drop pattern comprises:

obtaining a range of drop exclusion zones for the non-fill and extrusion defects using the sizes of the defect clusters and distances to drop edge exclusion; and creating the drop pattern using the range of drop exclusion zones.

16. The method according to claim 9, wherein determining the defect tolerance level comprises:

calculating the defect tolerance level as a median of the M defective pixels.

17. An imprint apparatus comprising:

an image sensor;

a processor; and a memory containing instructions that, when executed by the processor, cause the processor to perform operations comprising:

acquiring a plurality of images of a plurality of imprinted fields using the image sensor under varying process conditions associated with a defect, identifying defect pixels in a test image in the plurality of images using a standard image to provide a defect tolerance level, the standard image having no defects, performing clustering analysis on the identified defect pixels based on the defect tolerance level to obtain defect clusters, generate a process window based on the defect clusters, and creating an imprint process according to the process window, wherein the identifying defect pixels comprises:

obtaining N pixel intensities of N pixels at pixel locations in an area of the test image, determining N differences between the N pixel intensities and N standard intensities at standard locations in the standard image, and determining the defect tolerance level of M defective pixels in the N pixels, wherein M≤N and M and N are positive integer.

18. The imprint apparatus according to claim 17, further comprising:

imprinting a field on a substrate using the created imprint process.

19. A method of manufacturing an article, the method comprising:

forming a pattern on a substrate by imprinting a field on a substrate using the imprint process created by a method according to claim 9; and processing the substrate on which the pattern has been formed to obtain the article.

20. The imprint apparatus according to claim 17, wherein identifying defect pixels comprises:

classifying the N pixels as defective or non-defective pixels based on the corresponding N differences, wherein the standard locations correspond to the pixel locations in the standard image.

* * * * *